(12) United States Patent
Gupta

(10) Patent No.: US 12,021,526 B2
(45) Date of Patent: Jun. 25, 2024

(54) MIXED SIGNAL DEVICE WITH DIFFERENT PLURALITIES OF DIGITAL CELLS

(71) Applicant: Sandeep Kumar Gupta, Sunny Isles Beach, FL (US)

(72) Inventor: Sandeep Kumar Gupta, Sunny Isles Beach, FL (US)

(73) Assignee: Zeta Gig Inc., Sunny Isles Beach, FL (US)

( * ) Notice: Subject to any disclaimer, the term of this patent is extended or adjusted under 35 U.S.C. 154(b) by 255 days.

(21) Appl. No.: 17/684,098

(22) Filed: Mar. 1, 2022

(65) Prior Publication Data

US 2023/0261659 A1 Aug. 17, 2023

Related U.S. Application Data

(63) Continuation-in-part of application No. 17/672,689, filed on Feb. 16, 2022.

(51) Int. Cl.
*H03K 19/08* (2006.01)
*H03K 19/0185* (2006.01)
(Continued)

(52) U.S. Cl.
CPC . *H03K 19/0813* (2013.01); *H03K 19/018585* (2013.01); *H03K 19/17784* (2013.01); *H03K 19/20* (2013.01)

(58) Field of Classification Search
None
See application file for complete search history.

(56) References Cited

U.S. PATENT DOCUMENTS

| 6,333,571 B1 | 12/2001 | Teraoka et al. |
| 7,683,673 B2 | 3/2010 | Fensore |

(Continued)

FOREIGN PATENT DOCUMENTS

| CN | 105045362 A | 11/2015 |
| WO | WO2017012371 A1 | 1/2017 |

OTHER PUBLICATIONS

PCT/US 23/62021; Notification of Transmittal of the International Search Report and the Written Opinion of the International Searching Authority, or the Declaration, Dated Feb. 6, 2023, Received May 10, 2023.

(Continued)

*Primary Examiner* — Anh Q Tran
(74) *Attorney, Agent, or Firm* — Brian R. Short

(57) ABSTRACT

Apparatuses, and methods, for digital cells power reduction are disclosed. For an embodiment, a first plurality of digital logic cells are directly connected to a Vdd terminal and a Vss terminal that have a potential difference of VDD, a second plurality of digital logic cells being directly connected to a Vdd_R terminal and a Vss_R terminal, wherein a potential difference between the Vdd_R terminal and the Vss terminal is (VDD−X1), and a potential difference between the Vss_R terminal and the Vss terminal is X2, wherein at least one digital logic cell has at least one of (a) an input connected to an output of at least one digital logic cell of the second plurality, or (b) an output connected to an input of at least one digital logic cell of the second plurality. Vdd, Vdd_R and Vss_R terminal voltages can be generated by an array of devices.

15 Claims, 6 Drawing Sheets

(51) Int. Cl.
*H03K 19/17784* (2020.01)
*H03K 19/20* (2006.01)

(56) References Cited

U.S. PATENT DOCUMENTS

| | | |
|---|---|---|
| 7,915,937 B2 | 3/2011 | Cook |
| 9,459,646 B2 | 10/2016 | Tan |
| 2005/0030817 A1 | 2/2005 | Luk et al. |
| 2009/0051163 A1 | 2/2009 | Lili et al. |
| 2013/0135944 A1 | 5/2013 | Braceras et al. |
| 2014/0237275 A1* | 8/2014 | Zanotelli ............... G06F 1/3243 713/322 |
| 2017/0178559 A1* | 6/2017 | Kim ........................ G11C 19/28 |
| 2017/0316751 A1 | 11/2017 | Wang |
| 2019/0221181 A1 | 7/2019 | Li et al. |
| 2020/0125693 A1 | 4/2020 | Frederick, Jr. et al. |
| 2022/0190829 A1* | 6/2022 | Kang ................... H03K 19/003 |

OTHER PUBLICATIONS

Office action dated Nov. 2, 2023 for U.S. Appl. No. 17/672,689, filed Feb. 16, 2022.

Voltage-Stacked Power Delivery Systems: Reliability, Efficiency, and Power; An Zou, Student Member, IEEE, Jingwen Leng, Xin He, Member, IEEE, Yazhou Zu,Christopher D. Gill, Senior Member, IEEE, Vijay Janapa Reddi, Xuan Zhang, Member, IEEE; Journal of Latex Class Files, vol. 14, No. 8, Aug. 2015.

Voltage-Stacked GPUs: A Control Theory Driven Cross-Layer Solution for Practical Voltage Stacking in GPUs; An Zou, Jingwen Leng, Xin He, Yazhou Zu, Christopher D. Gill, Vijay Janapa Reddi, Xuan Zhang, Washington University in St. Louis, Shanghai Jiao Tong University, The University of Texas at Austin, Harvard University; 2018 51st Annual IEEE/ACM International Symposium on Microarchitecture.

* cited by examiner

MIXED SIGNAL DEVICE WITH DIFFERENT PLURALITIES OF DIGITAL CELLS

RELATED APPLICATIONS

This patent application is a continuation-in-part (CIP) of U.S. patent application Ser. No. 17/672,689 filed Feb. 16, 2022, which is herein incorporated by reference.

FIELD OF THE DESCRIBED EMBODIMENTS

The described embodiments relate generally to electronic devices. More particularly, the described embodiments relate to systems, methods and apparatuses for reducing power in digital logic cells by providing additional source and/or sink terminals and an array of devices that is used to generate the terminal voltages of digital logic cell.

BACKGROUND

In digital design one of the most critical design parameters is the power that it takes to perform any logic operations. Several power reduction techniques in the past have been architected and proposed. A technique that reduces power involves the use of a lowered supply voltage. Often any significant reduction on the power supply voltage, results in tardy rise times compared to fall times at the output of the digital cell with the lower power supply voltage when its input is connected to a cell that has the higher supply voltage or tardy fall times at the output of the digital cell with higher power supply voltage when its input is connected to the cell with the lower power supply voltage. This may distort the duty cycle in either case at the interface, add to higher propagation time delays of digital logic cells when combining the rise and fall time delays together and even lead to loss of functionality by the stage following the digital cell with the unbalanced rise or fall times, with the following cell after that not transitioning to the full logic levels for higher data or clock speeds. Furthermore, if Xtotal is the reduction in the power supply voltage to achieve a power reduction of $(VDD-Xtotal)^2/(VDD)^2$ then Xtotal needs to be maximized to achieve maximum power saving. However, to not increase delay by a large amount, Xtotal needs to be lesser than $VDD-max(V_{thp}, V_{thn})-\Delta Xtotal$, where $\Delta Xtotal$ represents the amount of overdrive margin the transistor has above threshold voltage. Usually for most timing critical designs a positive value of $\Delta Xtotal$ is needed for desirable strong inversion operation. A negative value of $\Delta Xtotal$ represents a transistor that is driven below its threshold (or sub-threshold regime) that may be allowable only in some designs that are not as timing critical. $V_{thp}$ is the threshold voltages of a PMOS transistor and $V_{thn}$ is the threshold voltage of a NMOS transistor used in the digital logic cells. Furthermore implementation of reduced VDD in addition to VDD is hard and even impractical for low values of VDD based on traditional voltage regulator technology.

It is desirable to have methods, apparatuses, and systems for power reduction in digital IC design and yet not significant delay addition due to either imbalanced rise and fall times and/or duty cycle degradation and/or driving the digital logic significantly into subthreshold operation in the desire of doing aggressive power reduction.

SUMMARY

An embodiment includes a mixed signal device including at least a plurality of digital logic cells. The mixed signal device includes at least a first plurality of digital logic cells being directly connected to a Vdd terminal and a Vss terminal, wherein the potential difference between the Vdd terminal and Vss terminal is a VDD, a second plurality of digital logic cells being directly connected to a Vdd_R terminal and a Vss_R terminal, wherein the potential difference between the Vdd_R terminal and the Vss terminal is (VDD-X1) and the potential difference between the Vss_R terminal and the Vss terminal is X2, wherein X1 and X2 are positive voltages and X1 and X2 both are less than half of VDD, wherein at least one digital logic cell of the first plurality of digital logic cells has at least one of (a) an input connected to an output of at least one digital logic cell of the second plurality, or (b) an output connected to an input of at least one digital logic cell of the second plurality, and wherein a first ratio of the voltage X1 to the voltage X2 is selected in a preselected range.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for significant power reduction in digital IC (integrated circuit) design. For at least some embodiments, the mixed signal device includes digital logic cells and also some analog circuitry and therefore have both digital signals and analog signals. For at least some embodiments, the mixed signal device includes only digital logic cells and therefore have only digital signals and no analog signals. An embodiment includes a digital logic cell that is a combination of at least one NMOS and one PMOS transistor connected to each other, having at least one input and having at least one output and directly connected to at least 2 terminals for sourcing and sinking the current, wherein the digital logic cell performs a Boolean logical relationship between input and output or a storage function. When the described embodiments include the statement that a digital logic cell is directly connected to two terminal V1 and V2, it implies a circuit configuration of the digital logic cell wherein a source terminal of at least one PMOS transistor of that digital cell is connected to the V1 terminal to source current and the source terminal of at least one NMOS transistor of that digital cell is connected to the V2 terminal to sink current. For an embodiment, V1 represents Vdd or Vdd_R and V2 represents Vss or Vss_R. For an embodiment, a mixed signal device includes at least a plurality of digital logic cells. For an embodiment, each digital logic cell and the mixed signal device includes at least a terminal to source current which is connected to a source terminal of a PMOS transistor, at least a terminal to sink current which is connected to source terminal of an NMOS transistor, and one or more inputs and one or more outputs and one or more clock signals that may not be listed but may be included in the digital logic cells or mixed signal device. For an embodiment, digital logic cells may perform a storage function.

Figure 1:
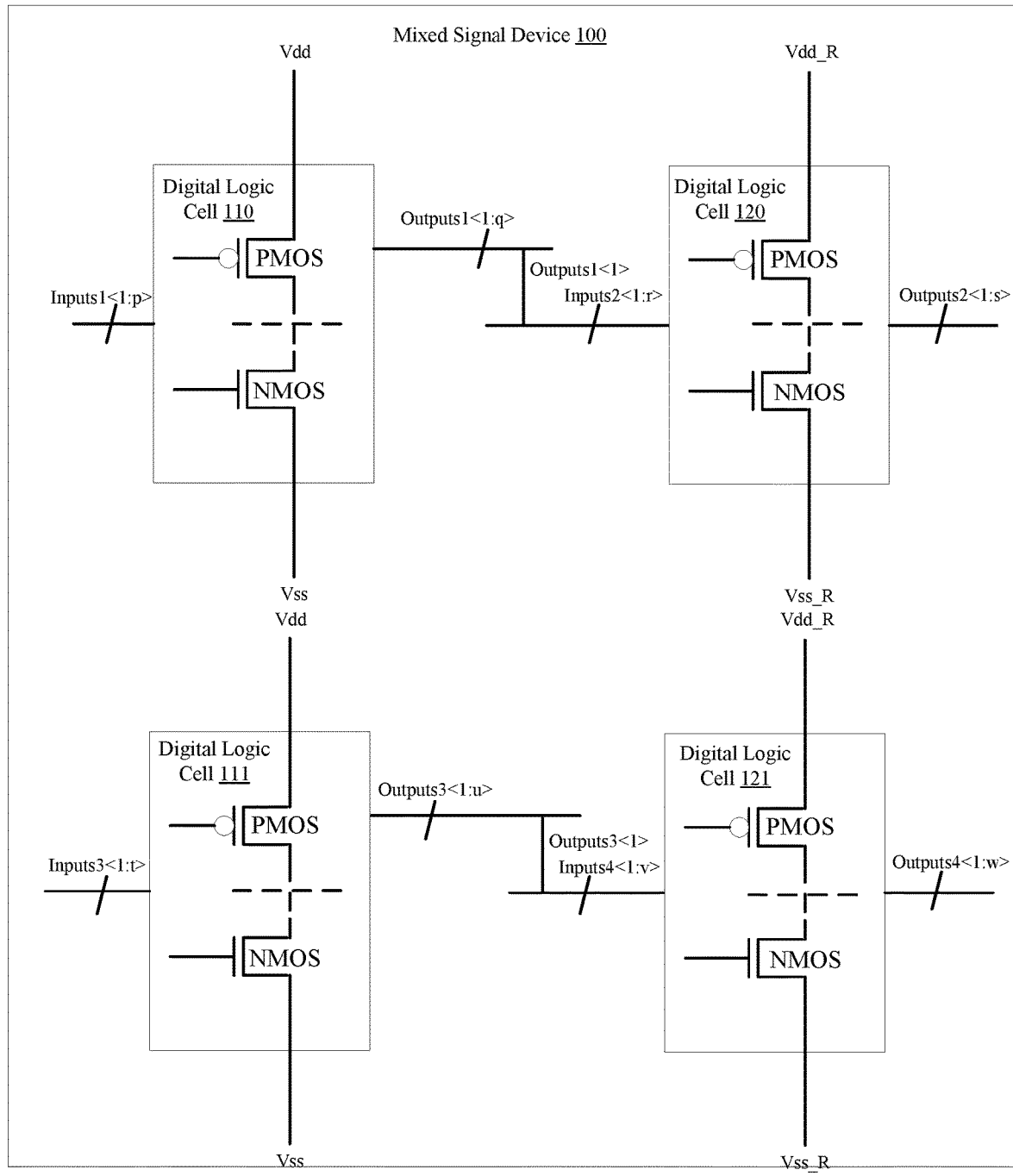
FIG. 1 shows a block diagram of a mixed signal device containing a plurality of digital logic cells, according to an embodiment.

FIG. 1 shows a block diagram of a mixed signal device 100 containing a plurality of digital logic cells 110, 111, 120, 121, according to an embodiment. That is, for an embodiment, the mixed signal device 100 includes at least a plurality of digital logic cells (such as, digital logic cells 110, 111, 120, 121). For an embodiment, a first plurality of digital logic cells (such as, digital logic cells 110, 111) are directly connected to a Vdd terminal and a Vss terminal, wherein the potential difference between the Vdd terminal and Vss terminal is a VDD. Further, for an embodiment, a second plurality of digital logic cells (such as, digital logic cells 120, 121) are directly connected to a Vdd_R terminal and a Vss_R terminal, wherein the potential difference between the Vdd_R terminal and the Vss terminal is (VDD−X1) and the potential difference between the Vss_R terminal and the Vss terminal is X2, wherein X1 and X2 are positive voltages and X1 and X2 both are less than half of VDD. For an embodiment, at least one digital logic cell of the first plurality of digital logic cells 110, 111 has at least one of (a) an input connected to an output of at least one digital logic cell of the second plurality of digital logic cells 120, 121, or (b) an output connected to an input of at least one digital logic cell of the second plurality of digital logic cells 120, 121, and wherein a first ratio of the voltage X1 to the voltage X2 is selected in a preselected range.

For an embodiment, a first ratio of the voltage X1 to the voltage X2 is selected in a preselected range. In an embodiment, ideally the preselected range is just a number 1, where the ratio of X1 to X2 is ideally 1. For this embodiment, this happens when the $\mu_n*(W/L)_n/\mu_p*(W/L)_p$ ratio in digital logic cells is closer to 1, (where $\mu_n$ is the mobility of an NMOS transistor and $\mu_p$ is the mobility of an PMOS transistor and $(W/L)_n$ is the ratio of size of an NMOS transistor and $(W/L)_p$ is the ratio of size of a PMOS transistor), the threshold voltages of the transistors between the cells of the first plurality and the second plurality are identical and threshold voltages of PMOS transistors to NMOS transistors within a digital logic cell are also identical and various other non-idealities of implementation are not present. However in the embodiments, wherein $\mu_n*(W/L)_n/\mu_p*(W/L)_p$ is different than 1, or the threshold voltages of the transistors between the cells of the first plurality and the second plurality are different or the threshold voltages of PMOS to NMOS are different, or other non-idealities are present, the first ratio of the voltage X1 to the voltage X2 may be selected to be different than 1 and in a preselected range. In an embodiment, the end points of the preselected range, may also depend on the difficulty in implementation of values of finely spaces voltages through either regulated power supply voltages or in some embodiments even other techniques like generating the same out of an array of devices. In some embodiments, the first ratio of X1 to X2 is kept as 1 and therefore the preselected range is (1,1). At least in some embodiments the preselected range is (0.3,3.3). Many more embodiments on the choice of X1 and X2 are discussed elsewhere.

For an embodiment, a second ratio that is defined as $(VDD-X1-X2)^2/(VDD)^2$ is less than a first preselected number.

First Preselected Number

It is to be noted that the first preselected number is approximately representative of the power saving possible in digital logic cells of the second plurality of digital logic cells. For an embodiment, the second ratio $(VDD-X1-X2)^2/(VDD)^2$ is referred to as the power reduction ratio and is chosen to be less than the first preselected number "PRtarget" (Power Reduction Target). For an embodiment, the first preselected number is selected for a certain power reduction target. For an embodiment the selection is made such that the power reduction target number is as low as possible, that in turn requires (X1+X2) (that is interchangeably referred to as Xtotal) to be higher than VDD*(1−sqrt (PRtarget); however other constraints in the design to be discussed later require (X1+X2) to be less than a certain number, that in turn limits the maximum choice of (X1+X2) and the value of first preselected number PRtarget. When reference is made to "sqrt( )" it mean square root of the number in the parenthesis. For an embodiment, the criteria of $(VDD-X1-X2)^2/(VDD)^2<PRtarget$ is referred to as inequality 1. For an embodiment, PRtarget is set to be the preselected number at the design stage considering all other design constraints, or even after manufacturing to take into account all manufacturing tolerances and non-idealities of device, by selection of X1 and X2 at an appropriate stage, before final deployment of device for it intended use.

For an embodiment, within the mixed signal device the first plurality and the second plurality of digital logic cells both operate as CMOS logic level operation (as opposed to any CML or differential logic levels of reduced differential voltages), where the outputs of digital logic cells of the first plurality swing between logic levels of (0, VDD) and the outputs of digital logic cells of the second plurality swing between logic levels of (X2, VDD−X1), where the potential of Vss is referenced as 0 here without any loss of generality as all voltages in the digital logic cells here are referenced to Vss.

An overdrive voltage $V_{ov}$ of a transistor is defined as (Vgs−Vth), wherein Vgs is the gate to source voltage of a transistor and Vth is the threshold voltage of a transistor. A positive overdrive voltage $V_{ov}$ generally represents a strong inversion desirable region of operation resulting in higher currents resulting in lesser delays (propagation delays of digital logic cells). A negative overdrive voltage $V_{ov}$ generally represents a sub-threshold (usually but not always undesirable) region of operation where currents exponentially decays, and delays exponentially increase as a function of such $V_{ov}$ voltage that is a direct function of supply voltage (wherein the supply voltage is most often the Gate to source voltage of transistors in the digital logic cell). Near the transition from strong inversion to sub-threshold regime (that is near an overdrive voltage of close to zero), the desired square law operation of the current with respect to the overdrive voltage, that is true in strong inversion, breaks down. It is therefore desirable that the overdrive voltage $V_{ov}$ is kept greater than zero by some margin and not be zero or negative to avoid driving transistors into a transition region of sub-threshold region or sub-threshold regime or at least not overly negative to drive transistors into deep sub-threshold regime.

It is to be noted that the delays, rise and fall times of digital logic cells that are connected to each other and belong to first plurality of digital logic cells are less than the delays, rise and fall times of the digital logic cells that are connected to each other and belong to second plurality of digital logic cells largely due to reduced voltage between terminals of digital logic cells of the second plurality of digital logic cells compared to the digital logic cells of the first plurality of digital logic cells.

For an embodiment, an output of a digital logic cell of the first plurality of digital logic cells connects to an input of a digital logic cell also of the first plurality of digital logic cells, a NMOS and PMOS transistors at such interface within the digital logic cell directly connected to the Vdd and Vss terminals have an overdrive voltage $V_{ov}$ of (VDD–$V1_{thn}$) and (VDD–$V1_{thp}$) respectively. For an embodiment, $V1_{thp}$ is the threshold voltages of a PMOS transistor and $V1_{thn}$ is the threshold voltage of a NMOS transistor used in the digital logic cell of first plurality digital logic cells. For an embodiment, the overdrive voltages largely determine the choice of voltage VDD in a given mixed signal device, and the minimum of (VDD–$V1_{thn}$) and (VDD–$V1_{thp}$) is referred to as $\Delta X1$, that is chosen to ensure that the delays and rise and fall times associated with the digital logic cells are kept below a certain desirable target. For an embodiment, since $\Delta X1$ is dependent largely on a choice of VDD, VDD is preselected at the design stage of the device, or even after manufacturing to take into account all manufacturing tolerances and non-idealities of device, before final deployment of device for it intended use. This represents an embodiment where a cascade of cells of digital logic cells that are of first plurality is used and that will likely be used in most critical timing paths where the delays through each digital logic cell are the most important to minimize, and needs to be therefore driven by highest overdrive voltages of the power supply.

For an embodiment, each of the two voltages (VDD–X1–$V1_{thn}$) and (VDD–X2–$V1_{thp}$) is greater than a second preselected number, where $V1_{thp}$ is a threshold voltage of a PMOS transistor and $V1_{thn}$ is a threshold voltage of a NMOS transistor, wherein the first plurality of digital logic cells includes the PMOS transistor and the NMOS transistor.

For an embodiment, an output of a digital logic cell of the second plurality of digital logic cells connects to an input of a digital logic cell of first plurality of digital logic cells, a NMOS and PMOS transistors at such interface within the digital logic cell of first plurality of digital logic cells have an overdrive voltage $V_{ov}$ of (VDD–X1–$V1_{thn}$) and (VDD–X2–$V1_{thp}$) respectively. For an embodiment, $V1_{thp}$ is the threshold voltages of a PMOS transistor and $V1_{thn}$ is the threshold voltage of a NMOS transistor used in the digital logic cell of first plurality of digital logic cells. For this embodiment, each of the overdrive voltages need to be kept higher than a certain second preselected number that is referred to as $\Delta X2$ that is chosen to ensure that the delays and rise and fall times associated with the digital logic cell of first plurality of digital logic cells at the interface are kept below a certain desirable target. For an embodiment, $\Delta X2$ is set to be a preselected number at the design stage of the device, or even after manufacturing of the device to take into account all manufacturing tolerances and non-idealities of device, by selection of X1 and X2 at an appropriate stage, before final deployment of device for it intended use. Usage of digital logic cells of first plurality of digital logic cells interspersed with digital logic cells of second plurality of digital logic cells is consistent with this embodiment and may be used for timing paths that are not the most critical but have medium level criticality.

In an embodiment, each of voltages (VDD–X2–$V2_{thn}$) and (VDD–X1–$V2_{thp}$) is greater than a third preselected number, where $V2_{thp}$ is the threshold voltage of a PMOS transistor and $V2_{thn}$ is the threshold voltage of a NMOS transistor, wherein the second plurality of digital logic cells includes the PMOS transistor and the NMOS transistor.

For an embodiment, an output of a digital logic cell of first plurality of digital logic cells connects to an input of a digital logic cell of second plurality of digital logic cells, NMOS and PMOS transistors at such interface within the digital logic cell of second plurality of digital logic cells will have an overdrive voltage $V_{ov}$ of (VDD–X2–$V2_{thn}$), (VDD–X1–$V2_{thp}$) respectively. For an embodiment, $V2_{thp}$ is the threshold voltages of a PMOS transistor and $V2_{thn}$ is the threshold voltage of a NMOS transistor used in the digital logic cell of second plurality of digital logic cells. For this embodiment, each of the overdrive voltages must be kept higher than a certain third preselected number that is referred to as $\Delta X3$ that is chosen to ensure that the delays and rise and fall times associated with digital logic cell of second plurality at the interface are kept below a certain desirable target. For an embodiment, $\Delta X3$ is set to be a preselected number at the design stage of the device, or even after manufacturing of the device to take into account all manufacturing tolerances and non-idealities of device, by selection of X1 and X2 at an appropriate stage, before final deployment of device for it intended use. Usage of digital logic cells of first plurality of digital logic cells interspersed with digital logic cells of second plurality of digital logic cells is consistent with this embodiment and may be used for timing paths that are not the most critical but have medium level criticality.

For an embodiment, a same type of transistors is used in the digital logic cells of the first plurality of digital logic cells and the second plurality of digital logic cells. Therefore, the $V1_{thp}$ and $V2_{thp}$ are the same voltages, and $V1_{thn}$ and $V2_{thn}$ are the same voltages (except for manufacturing tolerances and localized temperature variations in such transistors). For an embodiment, the threshold voltage of a PMOS transistor may be reasonably close in value to the threshold voltage of a NMOS transistor. For an embodiment, different types of transistors are used in the digital logic cell of the first plurality of digital logic cells and the digital logic cell of the second plurality of digital logic cells and the $V1_{thp}$ and $V1_{thn}$ and $V2_{thp}$ and $V2_{thn}$ can be all different threshold voltages in the above overdrive voltage terms.

In an embodiment, each of voltages (VDD–X1–X2–$V2_{thn}$) and (VDD–X1–X2–$V2_{thp}$) is greater than a fourth preselected number, where $V2_{thp}$ is the threshold voltage of a PMOS transistor and $V2_{thn}$ is the threshold voltage of a NMOS transistor, wherein the second plurality of digital logic cells includes the PMOS transistor and the NMOS transistor.

For an embodiment, an output of a digital logic cell of second plurality of digital logic cells connects to an input of a digital logic cell of second plurality of digital logic cells, a NMOS and PMOS transistors at such interface will have an overdrive voltage $V_{ov}$ of (VDD–X1–X2–$V2_{thn}$), (VDD–X1–X2–$V2_{thp}$) respectively. For this embodiment, each of the overdrive voltages must be kept higher than a certain fourth preselected number that is referred to as $\Delta X4$ that is chosen to ensure that the delays and rise and fall times associated with digital logic cells of second plurality of digital logic cells when used in cascade are still kept below a certain desirable target. For an embodiment, $\Delta X4$ is set to be a preselected number at the design stage of the device, or even after manufacturing of the device to take into account all manufacturing tolerances and non-idealities of device, by selection of X1 and X2 at an appropriate stage, before final deployment of device for it intended use. This embodiment includes a cascade of digital logic cells of second plurality of digital logic cells with lowest supply voltage across their terminals is used and that will likely be used in least critical timing paths than the most critical or medium level critical timing paths described previously. Therefore, the ΔX4 is kept lower than ΔX2 or ΔX3.

For an embodiment, ΔX4 is chosen to be greater than 0 depending on the delays acceptable in such least critical timing paths. For an embodiment, for timing domains that are the least critical and timing is relaxed, ΔX4 is chosen to be greater than −2*kT/q (wherein k is Boltzman's constant, T is the absolute temperature, q is the electron charge) that may drive the operation of such logic in sub-threshold regime which may be acceptable for timing. For another embodiment ΔX4 is chosen to be greater than at least 6kT/q (or approximately 155 mV as kT/q is approximately 25.86 mV at 300K temperature), where delays even in the least critical timing paths are an important parameter.

Figure 3:
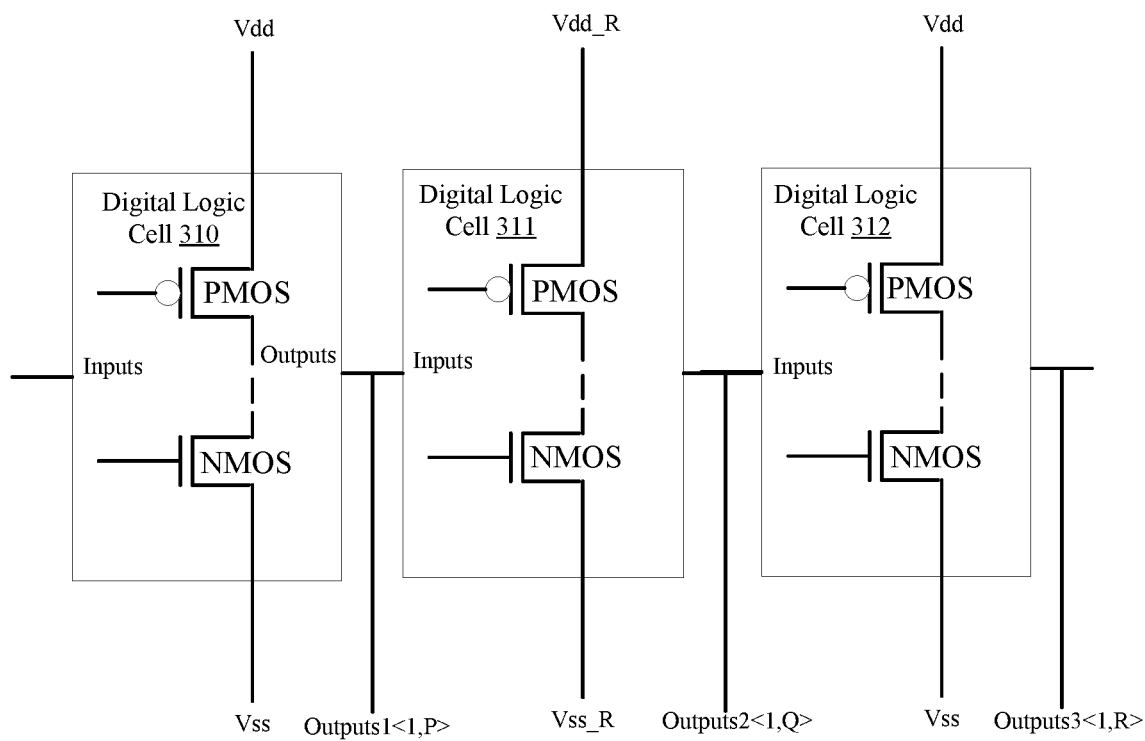
FIG. 3 shows a block diagram of a series of digital logic cells with different source and sink terminal voltages, according to an embodiment.
Figure 4:
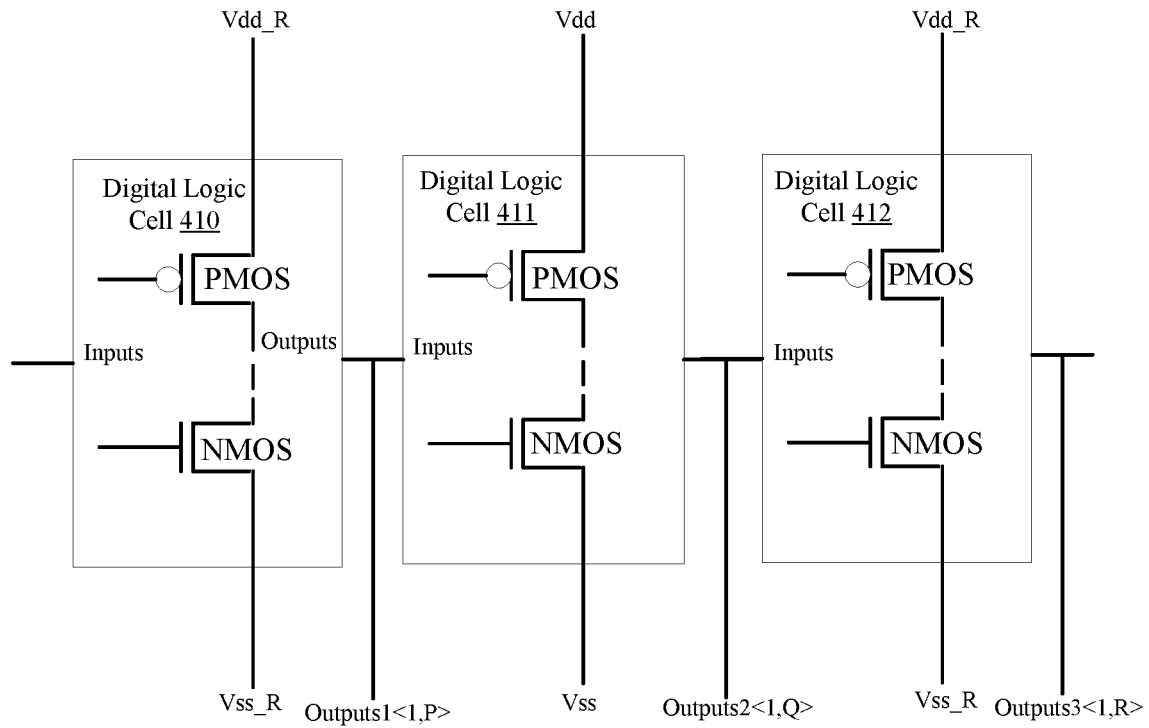
FIG. 4 shows a block diagram of a series of digital logic cells with different source and sink terminal voltages, according to another embodiment.

An example selection procedure of X1 and X2 is described herein. For an embodiment, to achieve a 50% power reduction ratio target PRtarget=50%, by inequality 1, X1+X2 (=Xtotal) need to be equal or greater than approximately 0.3*VDD (that is greater than 90 mV), if VDD is low enough for low power design (as low as 300 mV). If the preselected number ΔX4 is chosen to be 50 mV (that is 2kT/q), X1+X2 need to be less than (VDD−max (V2$_{thp}$, V2$_{thn}$)−ΔX4). For an embodiment, if V1thp=V2thp=V1thn=V2thn=150 mV, then this implies X1+X2(=Xtotal) need to be less than 100 mV. For that embodiment, that still meets the power target but quickly goes on to show that for such power targets, ΔX4 indeed is as low as 50 mV so such cells can only be used where least critical timing is desired. In embodiments where the digital logic cells of the first plurality are interspersed with digital logic cells of second plurality as shown in FIG. 3 and FIGS. 4, X1 and X2 both need to be less than (Vdd−V$_{th}$−max(ΔX2, ΔX3)). For an embodiment, ΔX2 and ΔX3 have similar design targets so it is conceivable that X1 and X2 both need to be less than (Vdd−Vth−ΔX2), where ΔX2=ΔX3. For an embodiment, an asymmetric choice of X1 and X2 where X1=0 and X2=100 mV can quickly be realized to be non-optimal as in that case ΔX2 would need to be 50 mV the same as ΔX4. For those embodiments, it is quickly realizable that the two cases where a) X1=0 and X2=Xtotal=100 mV or (b) X2=0 and X1=Xtotal=100 mV, correspond to the (Vdd_R, Vss_R) terminals being reduced to (Vdd, Vss_R) or (Vdd_R, Vss). In both such embodiments, ΔX2 and ΔX3 (for the simplistic case of equal threshold voltages of all transistors) becomes the same as ΔX4 and the delays due to at least one of the rise or fall times encountered in the digital logic cells at even the interface of first plurality to the second plurality would be as tardy as the delays encountered for digital logic cells entirely between the cells of the second plurality. That means in an embodiment, of highly asymmetric X1 and X2 where one of them is zero or close to zero (which is the case of digital logic cells with either (a) (Vdd, Vss_R) terminals or (b) (Vdd_R, Vss) terminals interfacing with digital logic cells of (Vdd,Vss) terminals), interspersing of the digital logic cells from first plurality and second plurality as shown in FIG. 3 and FIG. 4 would not have any difference in the delays or any advantage in timing delays as compared to cascaded two digital logic cells of the second plurality and in fact may have even tardier rise or fall time associated at the interface leading to significant duty cycle distortion. Therefore, in at least some embodiments, the usage of digital logic cells with (Vdd_R,Vss) terminals or digital logic cells with (Vdd, Vss_R) terminals, with the same Xtotal target as digital logic cells with (Vdd_R,Vss_R), have much worse timing and distorted duty cycle due to the asymmetric interface. To avoid such worse timing delays at such asymmetric interfaces, in some embodiments, level shifters may be used at an interface where a digital logic cell with (Vdd, Vss) terminals interfaces with a digital logic cell with (Vdd,Vss_R) terminals or (Vdd_R,Vss) terminals. However level shifters in these embodiments themselves are much bigger in size than the digital logic cells and that further limits the broad use of interspersing digital logic cells of (Vdd, Vss_R) terminal or (Vdd_R,Vss) terminals with the digital logic cells of (Vdd, Vss) terminals. Broad use of interspersing digital logic cells of first plurality with the digital logic cells of second plurality is possible largely when the values of X1 and X2 are non-zero and close to each other.

For an embodiment, a choice of X1 equal to X2 or nearly equal to X2 (continuing with the case where all the threshold voltages are similar value) results in higher ΔX2 and ΔX3 values compared to ΔX4 (100 mV in the above example as compared to 50 mV), and therefore, the overdrive voltages available at the interface of first plurality of digital logic cells and the second plurality of digital logic cells is higher than the overdrive voltages ΔX4 for cascaded digital logic cells of the second plurality of digital logic cells that are connected to each other. For that embodiment, therefore, the delays associated with the timing of the interface cells between the first plurality of digital logic cells and second plurality of digital logic cells is substantially lesser than the delay associated with the cascaded cells of the second plurality of digital logic cells alone. For the described embodiments, this advantage in lesser timing delays associated at the interface allows interspersing of the cells from second plurality of digital logic cells with the first plurality of digital logic cells for medium level critical timing paths. An exemplary embodiment of the interspersing is shown in FIG. 3 and FIG. 4. For the described embodiments, interspersing of digital logic cells of first plurality of digital logic cells with digital logic cells of second plurality of digital logic cells to gain any advantage in timing delay of such paths over the timing delay of paths that contain only digital logic cells of second plurality is possible largely only when (Vdd_R, Vss_R) is used and X1 and X2 are at least non-zero and in most cases, close to each other.

For other embodiments, if the threshold voltage of the cells is different between the digital logic cells of the first plurality of digital logic cells compared to digital logic cells of the second plurality of digital logic cells, then somewhat different values of X1 and X2 may be optimal. In other embodiments yet another ratio of $\mu_n*(W/L)_n/\mu_p*(W/L)_p$, is considered, where $\mu_n$ is the mobility of an NMOS transistor and $\mu_p$ is the mobility of an PMOS transistor and $(W/L)_n$ is the ratio of size of an NMOS transistor and $(W/L)_p$ is the ratio of size of a PMOS transistor, then somewhat different values of X1 and X2 may be optimal for delay minimization at the interface of the cells of the first plurality and the second plurality as well. However, in most of embodiments it can be shown that one of X1 or X2 being zero for the same value of desired Xtotal (=X1+X2), wherein a certain Xtotal voltage is required for a given power reduction, results in worse timing delays at the interface of the cells with first and second plurality of digital logic cells, than the non-zero optimized choice of X1 and X2.

For at least some embodiments where $\mu_n^*(W/L)_n/\mu_p^*(W/L)_p$ is significantly different than 1, or the threshold voltages of the transistors between the cells of the first plurality and the second plurality are different, the choice of X1 and X2 may be different as stated before and the criteria for the selection of X1 and X2 may change. In such embodiments, the cell that has an output connected to the interface of the digital logic cells of first plurality and second plurality may be referenced as the first digital logic cell of the interface, and the cell that has an input connected to the interface of the digital logic cells of the first plurality and second plurality may be referenced as the second digital logic cell of the interface. In such embodiments, to determine the optimal values of X1 and X2, the ratio of a rise time to the fall time of a voltage signal at the outputs of the second digital logic cell of the interface is kept within a certain range. In some embodiments, the range of such rise and fall times may be chosen based on design criteria.

In an embodiment, a first ratio of the voltage X1 to the voltage X2 is selected in a preselected range. In an embodiment, ideally the preselected range is just a number 1, where the first ratio of X1 to X2 is ideally 1. For this embodiment, this happens when the $\mu_n^*(W/L)_n/\mu_p^*(W/L)_p$ ratio in digital logic cells is 1, the threshold voltages of the transistors between the cells of the first plurality and the second plurality are identical and threshold voltages of PMOS to NMOS are also identical and various other nonidealities of implementation are not present. However in the embodiments, wherein $\mu_n^*(W/L)_n/\mu_p^*(W/L)_p$ is different than 1, or the threshold voltages of the transistors between the cells of the first plurality and the second plurality are different or the threshold voltages of PMOS to NMOS are different, or other non-idealities are present, the first ratio of the voltage X1 to the voltage X2 may be selected to be different than 1 and in a preselected range. In an embodiment, the end points of the preselected range for the first ratio, may also depend on the difficulty in implementation of values of finely spaces voltages through either regulated power supply voltages or in some embodiments even other techniques like generating the same out of an array of devices.

For an embodiment, to summarize the selection procedure of first preselected number (PRtarget), second preselected number($\Delta$X2), third preselected number($\Delta$X3), fourth preselected number($\Delta$X4) and the preselected range: for at least some embodiments, the fourth preselected number is chosen based on how many digital logic cells of the second plurality are used in the design in series with each other and the timing requirements of the portion of the logic that such digital logic cells of second plurality are used in series with each other, where a less stringent constraints on that timing setting a lower value of $\Delta$X4, wherein the choice of a minimum fourth preselected number sets the limit on the maximum value of (X1+X2) and the maximum value of (X1+X2) in turn sets the first preselected number PRtarget. For some embodiments, the first preselected number PRtarget, is kept anywhere in the range of (0.1,0.95). For some embodiments, the fourth preselected number can be chosen to be as high as 6*kT/q based on the timing requirements of the portion of the logic that such digital logic cells of second plurality are used in series with each other. For other embodiments the fourth preselected number is chosen to be as low as −2kT/q where the timing requirements of the portion of the logic that such digital logic cells of second plurality are used in series with each other are relaxed. For many embodiments the fourth preselected number is chosen in the range of (−2kT/q,6kT/q) (which is approximately (−52 mV,155 mV) at approximately 300 Kelvin temperature), depending on the timing constraints of the design, though choices outside that range are possible. In another embodiment, the second and third preselected numbers are chosen based on the timing requirement of the digital logic where interspersing of the digital logic cells of first plurality is done with the digital logic cells of the second plurality; the choice of a minimum second and third preselected number set the limit on the maximum value of (X1+X2) and the maximum value of (X1+X2) sets the first preselected number PRtarget. For some embodiments, the second and third preselected numbers are chosen to be higher than the fourth preselected number by at least one kT/q, and in other embodiments, the second and the third preselected numbers are chosen to be higher than fourth preselected number by (X1+X2)/2 and in other embodiments the second and the third preselected numbers are chosen to be higher than fourth preselected number by min (X1, X2), and in other embodiments the second and third preselected numbers are chosen independently of the fourth preselected number and on the basis of the timing requirement of the digital logic where the interspersing of the digital logic cells of first plurality is done with the digital logic cells of the second plurality. For an embodiment, the ratio (X1/X2) can be kept as 1, and the preselected range in that case is (1,1), and for some embodiments, the preselected range, instead of being 1, is (0.3,3.3) (end-points are included in the parenthesis representation), depending on (a) the extent of the difference of the threshold voltages of PMOS and NMOS transistors and/or (b) the extent of the difference of the threshold voltages of the digital logic cells of the first plurality to the digital logic cells of the second plurality, and/or (c) the extent that the ratio of $\mu_n^*(W/L)_n/\mu_p^*(W/L)_p$ in each of the digital cells is different than 1.

For at least some of the described embodiments that include usage of non-zero X1 and X2 and in many cases close to equal values of X1 and X2 to realize a total drop of X1+X2 to result in the same power reduction target, leads to significantly better delays at the interface of the digital logic cells of first plurality and second plurality. Therefore in some embodiments, at least 3 or more different implementations may be possible for different timing critical domains in a digital design, where for the most critical timing paths only the digital logic cells of the first plurality are used, for medium critical timing paths the cells of the first plurality are interspersed with the cells of the second plurality to save as much power as possible by such interspersing (where for 50% interspersing, up-to 25% power reduction may be obtainable on such lesser but medium critical timing paths), and for the least critical timing paths, the cells of second plurality are used, leading to even higher power savings. In various embodiments, it is to be understood that various combinations (much larger than 3) of the amount of interspersing of the digital logic cells from first and second plurality may be used and therefore with efficient use of the digital logic cells of second plurality significant power savings are possible without compromising the functionality of the mixed signal device.

For an embodiment, a third ratio of a first number of the digital logic cells of the second plurality of digital logic cells in the mixed signal device to a second number of the digital logic cells of the first plurality of digital logic cells in the mixed signal device exceeds a preselected number designated as cellcount1.

For an embodiment, the mixed signal device comprises of T timing domains, where each of T timing domains comprise a third plurality of digital logic cells; wherein $RT1_t$ is a fourth ratio of the number of digital logic cells of the second plurality to the number of digital logic cells of the first plurality, in the timing domain t, for t=1:T; wherein $RT1_t$ is greater than a preselected number $cellratio_t$ for t=1:T; and wherein $RT1_t$ is lesser than $RT1_{t+1}$ for t=1:T−1, where T is a positive integer greater than or equal to 2

For an embodiment, each timing domain t has a fifth ratio $RT2_t$ defined as substantially same as a ratio of a sum of propagation delay of all digital logic cells in the timing domain divided by a total number of logical and storage operations performed in the timing domain; and wherein $RT2_t$ is desired to be lesser than $RT2_{t+1}$ for t=1:T−1.

In the above described embodiments T timing domains may be defined inside the mixed signal device, where each timing domain t to consist of digital logic cells that face different levels of constraints on their propagation delays and timing than any other timing domain t+1 for t=1:T−1. In some embodiments, timing domains may contain different ratios of numbers of digital logic cells of the second plurality to the number of digital logic cells of the first plurality. In the above described embodiments, a lower $cellratio_t$ or lower $RT1_t$ would suggest lesser use of digital logic cells of second plurality implying use for timing domains where timing is critical and therefore that would correlate with the ratio $RT2_t$, that is defined as substantially same as a ratio of a sum of all propagation delays of all cells in the timing domain t divided by the total number of logical and storage operations performed in that timing domain t, to be also desired to be lower. In the embodiment when reference is made to "defined as substantially same as the sum . . . " it is to be understood that the sum of all propagation delays is to be considered in a typical case when being considered between different timing domains, where such propagation delays can vary substantially with process, voltage, temperature and mismatches which can change the ratio defined for nominal conditions substantially over such range of variations and that is why the ration is defined as "substantially same" and not "exactly the same".

For an embodiment, each timing domain t has a higher number of critical timing paths than timing domain t+1 for t=1:T−1.

In the above-described embodiment a lower $cellratio_t$ or lower $RT1_t$ would suggest lesser use of digital logic cells of second plurality implying use for time domains where timing is critical or there are higher number of critical timing paths and a higher $cellratio_t$ or higher $RT1_t$ would suggest timing domains where there are lesser number of critical timing paths. For an embodiment, this may be done for optimal amount of power savings by higher use of digital logic cells of second plurality in lesser critical timing domains and yet not violating timing of critical paths by choosing lesser number of digital logic cells of second plurality in such lesser critical timing path domains and for medium number of critical timing paths an optimal ratio between the number of usage of digital logic cells of second plurality to the digital logic cells of first plurality may be used. For an embodiment, no requirement of level shifters and no requirements of separate N–wells or separate deep N–wells in between cells of first plurality and digital logic cells of second plurality, makes the interspersing of digital logic cells of second plurality with the digital logic cells of first plurality possible for free use in medium critical timing domains, without extra power and area penalties.

For an embodiment, a critical timing path is defined as the path between an input and an output with a high propagation delay due to a larger number of logical (or storage) operations that have to be performed in such a path, where the high propagation delay is such that it is substantially close to the timing budget available for such delays before such output has to retimed on the edge of a clock signal. For an embodiment, the "critical" portion of that critical timing path would therefore be to keep the propagation delay of the large number of logical (or storage) operations to be less than the total timing budget before that output is latched or timed or captured on a clock edge. For an embodiment, the higher the number of the critical timing paths in a given domain the more stringent the design is for timing, and for more stringent timing needs, the propagation delays need to be kept smaller for each component (digital logic cells) and therefore a smaller proportion of digital logic cells of second plurality is used in such domains for lesser power savings in those critical timing domains.

For at least some embodiments, the $cellratio_t$ are based on the power targets for the whole device (PTarget) and the ratios that determine $cellratio_t$ are selected based on being able to partition the design of the mixed signal device into several timing domains of timing criticality, which domains could be "critical timing domain" of design associated with most critical timing, "lesser critical timing domain" of design associated with somewhat critical timing and "lowest critical timing domain" of design associated with least critical timing. More such domains may be defined. When reference is made in described embodiments to the "number of digital logic cells" in the statements "a third ratio of a first number of the digital logic cells of the second plurality of digital logic cells in the mixed signal device to a second number of the digital logic cells of the first plurality of digital logic cells in the mixed signal device" or to "$RT1_t$ is a ratio of the number of digital logic cells of second plurality to the number of digital logic cells of the first plurality"— that means the total number of digital logic cells of the second plurality or first plurality, where such number is expressed as commonly done in digital design practice as a "NAND gate equivalent" of cells of second plurality or first plurality. A "NAND gate equivalent" number of "any number of digital logic cells" approximately means the ratio of the total number of transistors used in the "any number of digital logic cells" divided by 4, as NAND gate has 4 transistors. Based on the different domains of these timing critical areas of design a different ratio may be used in each domain where $cellratio_{t+1}$ is higher than $cellratio_t$. For highest power saving, cellcount1 and $cellratio_t$ in general should be kept as high as possible.

It is further understood that for at least some embodiments, the realization of the voltage X1 and X2 from available voltage regulated power supplies may be impractical and cost inefficient for various values of X1 and X2 and VDD especially where VDD is below 1V wherein X1, X2 are further a fraction of Vdd. At least some embodiments that include generation of the voltages X1 and X2 and VDD are described and shown in the FIG. 6.

Figure 2:
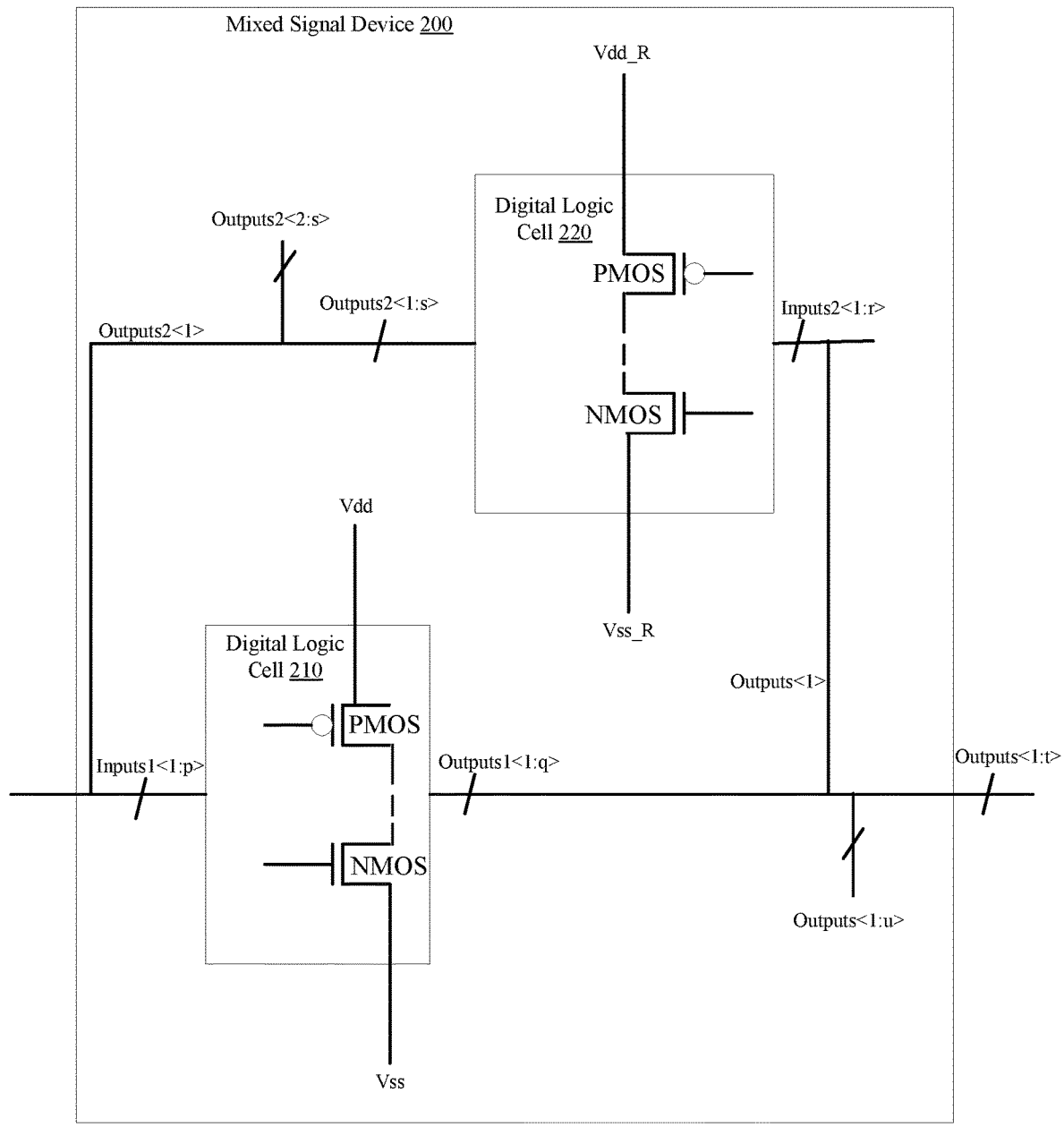
FIG. 2 shows a block diagram of a mixed signal device containing digital logic cells of a storage function, according to an embodiment.

FIG. 2 shows a block diagram of a mixed signal device 200 containing digital logic cells 210, 220 of a storage function, according to an embodiment. For an embodiment, wherein the storage digital logic cell includes at least one digital logic cell (such as digital logic cell 210) of the first plurality of digital logic cells and at least one digital logic cell (such as, digital logic cell 220) of the second plurality of digital logic cells, and wherein the at least one digital logic cell of the first plurality of digital logic cells is configured to be in a feedforward path from an input of the storage digital logic cell to an output of the storage digital logic cell and the at least one digital logic cell of the second plurality of digital logic cells is configured to be in a feedback path from an output to an input of the storage digital logic cell.

For at least some embodiments, a storage digital logic cell is defined as a digital logic cell performing some function of storage, where in the simplest storage elements are a latch or a Flip–Flop. For an embodiment of a storage digital logic cell, the feedforward path from the input is more timing critical and the feedback path, which feeds the output signal back to the input, is not as timing critical nor requires as much drive strength for the digital logic cells. Therefore, for an embodiment the feedforward path contains digital logic cells that are of the first plurality and the feedback path includes digital logic cells that are of the second plurality and that saves substantial power, and yet the interface timing between the two do not degrade as much as they would if (Vdd,Vss_R) or (Vdd_R,Vss) terminals had been used in the second plurality as opposed to the use of (Vdd_R, Vss_R).

FIG. 3 shows a block diagram of a series of digital logic cells 310, 311, 312 with different source and sink terminal voltages, according to an embodiment. For this embodiment, at least one of a plurality of outputs of a digital logic cell of the first plurality of digital logic cells, is connected to at least one of a plurality of inputs of a digital logic cell of the second plurality of digital logic cells. Further, for at least some embodiment, at least one of a plurality of outputs of the digital logic cell of the second plurality of digital logic cells, is connected to at least one of a plurality of inputs of a different digital logic cell of the first plurality of digital logic cells.

For the embodiment of FIG. 3, one digital logic cell (such as digital logic cell 311) of the second plurality of the digital logic cells may be interposed in between two digital logic cells of the first plurality of digital logic cells (such as, digital logic cells 310, 312) and that may be configured this way for power reduction in any series connections of three or more digital logic cells at the expense of acceptable delay addition and used for medium level critical timing paths as previously described. For an embodiment, a series connection of two digital logic cells is defined when at least one of the outputs of first digital logic cell feeds into at least one of the inputs of the second digital logic cell. For an embodiment, a series connection of three or more digital logic cells may be defined as when at least one of the outputs of first digital logic cell feeds into at least one of the inputs of the second digital logic cell and at least one of the outputs of the second digital logic cell feeds into at least one of the inputs of the third digital logic cell. For an embodiment, a series/parallel connection of three or more digital logic cells may be defined when at least one of the outputs of first digital logic cell feeds into at least one of inputs of the second digital logic cell and at least one of the other outputs of the first digital logic cell feeds into at least one of the inputs of the third digital logic cell. In an embodiment, a parallel connection of three or more digital logic cells may be defined when at least one of the inputs of the three digital logic cells is connected to each other.

FIG. 4 shows a block diagram of a series of digital logic cells 410, 411, 412 with different source and sink terminal voltages, according to another embodiment. For an embodiment, at least one of a plurality of outputs of a digital logic cell of the second plurality of digital logic cells, is connected to at least one of a plurality of inputs of a digital logic cell of the first plurality of digital logic cells, and further at least one of a plurality of outputs of the digital logic cell of the first plurality of digital logic cells is connected to at least one of a plurality of inputs of a different digital logic cell of the second plurality of digital logic cells.

For the embodiment of FIG. 4 it is shown that one digital logic cell (such as digital logic cell 411) of first plurality of digital logic cells may be interposed in between two digital logic cells of the second plurality of digital logic cells (such as, digital logic cells 410, 412) and that may be done for power reduction in any series connections of digital logic cells at the expense of acceptable delay addition and used for medium level critical timing paths as previously described.

For at least some embodiments, timing constraints may be set by first characterizing digital logic cells delays, rise and fall times of first and second plurality when subjected with input signals of different logic levels of (VDD, 0) and (VDD−X1, X2), where potential of Vss is considered as 0 without any loss of generality as every potential may be referred to Vss. For at least some embodiments, extra timing slack may be added on the delays and rise and fall times of digital logic cells of second plurality when they are subjected with input signals of logic levels (VDD−X1, X2) to account for the undesirable and difficult to characterize effects of timing degradations for near sub-threshold behavior of transistors, when such digital cells of second plurality are subjected to logic levels of (VDD−X1, X2). For at least some embodiments, for segments of digital logic circuitry, that only have a medium level criticality of timing in timing paths, usage of the digital logic cells of second plurality would be allowed along with the digital logic cells of the first plurality, but for the majority of this segment of medium level criticality, the series connections of two digital logic cells of the second plurality may not be allowed, and even constraints can be written to avoid such series connections of digital logic cells of second plurality for more than a certain percentage, to force interspersing of the digital logic cells of first and second plurality instead of series connections of digital logic cells of second plurality. For at least some embodiments, for segments of digital logic circuitry, that only has low level criticality of timing in timing paths, digital logic cells of second plurality may be deployed more often even in series connections of two or more digital logic cells of second plurality.

Figure 5:
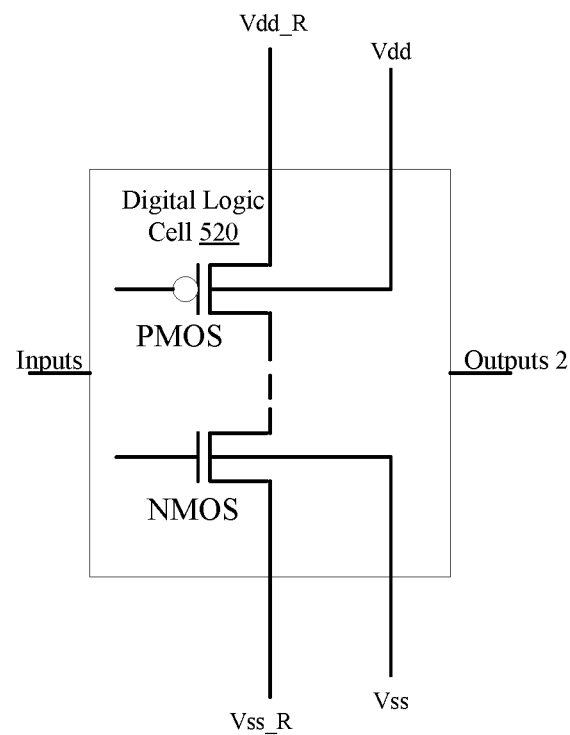
FIG. 5 shows a block diagram of a digital logic cell, wherein body terminals of the digital logic cell are connected to different terminals than the source or sink terminals of the digital logic cell, according to another embodiment.

FIG. 5 shows a block diagram of a digital logic cell 520, wherein body terminals of the digital logic cell 520 are connected to different terminals than the source or sink terminals of the digital logic cell 520, according to another embodiment. As shown, for an embodiment, at least one digital logic cell of the second plurality of digital logic cells, comprises an NMOS transistor, wherein a body terminal of the NMOS transistor is connected to the Vss terminal. This embodiment can be implemented so that the digital logic cells with different Vss and Vss_R can be located in the same substrate, allowing easier interspersing of digital logic cells of the first plurality with digital logic cells of the second plurality, without requiring extra layout spacing of Deep N-wells that may be required if the body terminals of the NMOS transistors of the digital logic cells of the second plurality were to be connected to their source terminals Vss_R which makes two different body terminals Vss and Vss_R. It is understood that in doing so the $V_{sb}$ voltage of the NMOS transistor can be increased from 0 to a higher voltage X2 and that may increase the threshold voltage of the NMOS transistor but that may either be acceptable as for modern FINFET technology, such effect is minimal or if implemented in some other technology, that effect may have to be tolerated to avoid area increase due to Deep N-well spacing.

For another embodiment, the body terminal of the NMOS that has its source connected to Vss_R is also connected to Vss_R. In this embodiment, the area of implementation might be increased due to increased Deep N-Well spacing as previously described, but not the threshold voltage and it may be done when the threshold voltage increase is not tolerable. It is to be recognized that embodiments requiring Deep N-well with their associated spacing rules, interspersing of the digital logic cells of the second plurality with digital logic cells of the first plurality would become more impractical because the resulting mixed signal device, that incorporates such interspersed digital logic cells of different pluralities, shall become higher area and higher parasitic capacitances, and may be even higher power due to increased extra parasitic capacitances of routing due to bigger device, that may even partially reduce the entire advantage of the use of such digital logic cells of second plurality.

FIG. 5 further shows an embodiment of the mixed signal device, wherein at least one digital logic cell of the second plurality of digital logic cells, comprises a PMOS transistor, wherein a body terminal of the PMOS transistor is connected to the Vdd terminal. This embodiment may be implemented so that the digital logic cells with different Vdd and Vdd_R can be located in the same N-well, allowing easier interspersing of digital logic cells of the first plurality with digital logic cells of the second plurality, without requiring extra layout spacing of N-wells that may be required if the body terminals of the PMOS transistors of the digital logic cells were to be connected to their source terminals Vdd_R which makes two different body terminals Vdd and Vdd_R, thereby making the mixed signal device bigger. It is understood that in doing so the $V_{bs}$ voltage of the PMOS transistor can be increased from 0 to a higher voltage X1 and that may increase the threshold voltage of the PMOS transistor but that may either be acceptable as for modern FINFET technology, such effect is minimal or if implemented in some other technology, that effect may have to be tolerated to avoid area increase due to N-well spacing.

For another embodiment, the body terminal of the PMOS that has its source connected to Vdd_R is also connected to Vdd. In this embodiment, the area of implementation might be increased due to increased N-Well spacing as described before but not the threshold voltage and it may be done where such threshold voltage increase is not tolerable. It is to be recognized that embodiments requiring in different N-wells with increased N-well spacing and their associated spacing rules, interspersing of the digital logic cells of the second plurality with digital logic cells of the first plurality would become more impractical because the resulting mixed signal device, that incorporates such interspersed digital logic cells of different pluralities, shall become higher area and higher parasitic capacitances, and may be even higher power due to increased extra parasitic capacitances of routing due to bigger device, that may even partially reduce the entire advantage of the use of such digital logic cells of second plurality with the digital logic cells of the first plurality.

For the described embodiments, it is to be realized that connecting the body terminals to Vss or Vdd to allow reduced layout spacing without requiring extra deep N-Wells or extra N-Wells is more allowable without any penalties to the design, when X1 is close to X2 or equal to (X1+X2)/2 for a given power saving target. For an embodiment wherein digital logic cells are to be connected to (Vdd_R,Vss) or (Vdd,Vss_R) which represents X1=0 or X2=0 result in double the reverse bias of the junction voltage $V_{sb}$ or $V_{bs}$ for the same power saving target based on X1+X2, possibly either leading to (a) higher threshold voltage of the transistors if separate Deep N-wells or separate N wells are not used leading to delay and timing degradation due to higher threshold voltages or (b) high layout area and higher interconnect routing capacitance if Deep N-well or N wells are used again leading to delay and timing degradation. Therefore, for a given aggressive power reduction target that sets the value of X1+X2, interspersing of digital logic cells of second plurality with digital logic cells of first plurality would be far more practical to not increase threshold voltages nor require layout area increases due to deep N-well spacing or N-well spacing rules when X1 and X2 are balanced and close to each other.

For an embodiment, the mixed signal device wherein at least one of the potential difference between the Vdd terminal and the Vss terminal, or the potential difference between the Vdd_R terminal and the Vss terminal, or the potential difference between the Vss_R terminal and the Vss terminal, is generated by an array of devices, wherein a first plurality of the array of devices are substantially similar to the mixed signal device, and the first plurality of the devices in the array of devices includes the mixed signal device, and wherein the array of devices includes one or more dimensions.

For an embodiment, at least the first plurality of the devices in the array of devices are substantially similar to the extent that all components of the devices are designed to be the same and the number and type of input terminals and output terminals and terminals to source and sink currents are the same on each device, but the devices may not be identical to the extent that the devices may receive different input signals and all components of the devices while designed to be the same, may not be identical at least due to different manufacturing tolerances, different temperatures, different input signals or slightly different voltages to source or sink currents.

For an embodiment, in which only one voltage for terminal Vdd is to be generated, this embodiment is implementable by a column of the array of devices. In other words, this embodiment may include a 1-dimensional array of substantially similar N devices that are connected in series, wherein the Vss terminal of device at location (i+1) within the array of devices is connected to Vdd terminal of the device at location (i) of the array of devices for i=1:N−1, and the Vdd terminal of the device at location (N) is connected to a higher voltage terminal of a power supply and the Vss terminal of the device at location 1 is connected to a lower voltage terminal of the power supply, wherein such power supply having a voltage substantially the same as N*VDD Further, for an embodiment, where only one voltage Vdd_R is generated, this embodiment is implementable by a column of the array of devices. In other words a 1-dimensional array, of substantially similar N devices that are connected in series wherein Vss terminal of device at location (i+1) within the array of devices is connected to Vdd_R terminal of the device at location (i) within the array of devices for i=1:N−1 and the Vdd_R terminal of the device at location (N) is connected to a higher voltage terminal of a power supply and the Vss terminal of the device at location 1 is connected to a lower voltage terminal of the power supply, wherein such power supply having a voltage substantially the same as N*(VDD−X1).

For an embodiment, where only one voltage Vss_R were to be generated, that would be implementable by a column. In other words, a 1-dimensional array of substantially similar N devices that are connected in series wherein Vss_R terminal of device at location (i+1) within the array of devices is connected to Vdd terminal of the device at location (i) within the array of devices for i=1:N−1 and the Vdd terminal of the device at location (N) is connected to a higher voltage terminal of a power supply and the Vss_R terminal of the device at location 1 is connected to a lower voltage terminal of the power supply, wherein such power supply having a voltage of N*(VDD−X2).

For an embodiment, the potential difference between the Vdd terminal and the Vss terminal, and the potential difference between the Vdd_R terminal and the Vss terminal, and the potential difference between the Vss_R terminal and the Vss terminal, are generated by an array of devices, wherein a first plurality of devices in the array of devices are substantially similar to the mixed signal device, and the first plurality of devices in the array of devices includes the mixed signal device, and wherein the array of devices includes one or more dimensions. For this embodiment at least a 2-dimensional array may be used.

Figure 6:
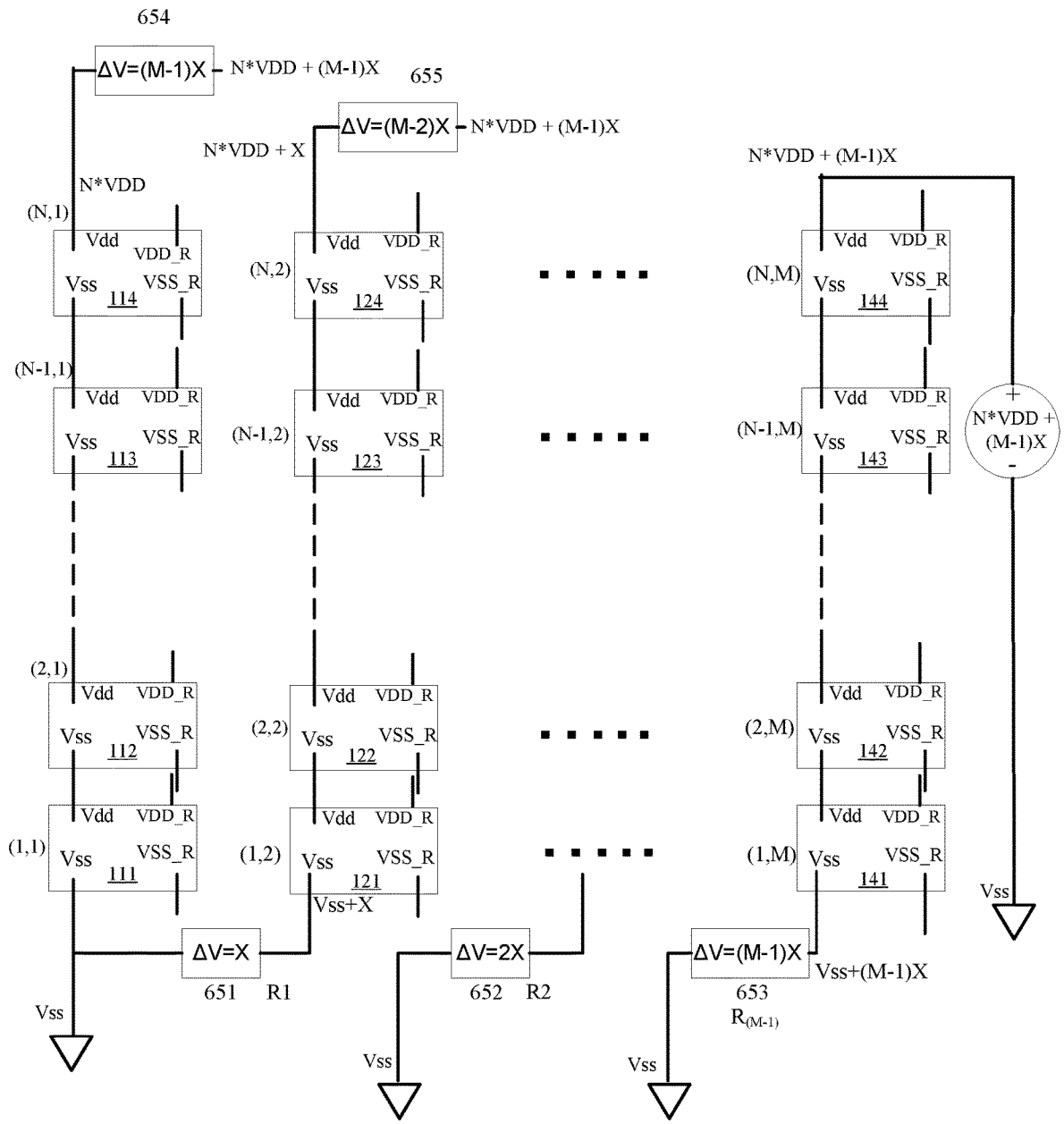
FIG. 6 shows a block diagram of an array of devices that include power supply stacking and staggered voltage distribution, according to another embodiment.

FIG. 6 shows a block diagram of an array of devices 111, 112, 113, 114, 121, 122, 123, 124, 141, 142, 143, 144 that include power supply stacking and staggered voltage distribution, according to another embodiment. For an embodiment, the array of devices 111, 112, 113, 114, 121, 122, 123, 124, 141, 142, 143, 144 includes at least 2 or more dimensions. For an embodiment, the potential differences of the Vdd, Vdd_R and Vss_R terminals compared to the Vss terminal are generated by the array of devices. For an embodiment, each device within the array of devices is specified by a location (i,j) within the array of devices, wherein i is a row index ranging from 1 to N, and j is a column index ranging from 1 to M, where M is a positive integer greater than or equal to 2 and N is a positive integer greater than or equal to 1; wherein for values of N greater than or equal to 2, for i=2:N and for j=1:M, for at least a first majority of the devices in the array of devices, the Vss terminal of each of the devices in the first majority of the devices at location (i,j) is connected to the Vdd terminal of the device at location (i−1,j), the mixed signal device is included in the first majority of the devices in the array of devices, wherein a potential of the Vss terminal of each device at any location (1,j+1) of the array of devices is generated to be higher than a potential of the Vss terminal for another device at location (1,j) by a voltage $X_j$, for j=1:(M−1), and sum of all $X_j$ voltages for j=1:(M−1) is at least greater than or substantially same as 0.25*VDD.

For some embodiments, if $X_j$ are all substantially the same voltage X, then M*X−VDD is designed to be as close to 0 if possible but if not possible to be close to zero then M*X−VDD is in the range (−X/2,X/2) where bracket notation indicates end points are included in the range. For an embodiment, when M=2, there is only one $X_j$ voltage that is $X_1$ and that is kept "substantially the same" voltage as VDD/2. For an embodiment due to non-idealities in the array of devices even though intended voltage of the sum of all voltages $X_j$ is designed to be at least greater than or substantially same as VDD/2, the condition that is minimally needed to be met is that sum of all $X_j$ voltages for j=1:(M−1) is greater than 0.25*VDD. For an embodiment, where all $X_j$ are equal to X, the balanced array operation is obtained for M*X=VDD, and so X=VDD/M. For an embodiment, M=2, there is only one value of $X_j$ equal to X, and therefore the sum of $X_j$ is designed to be VDD/2 but for defining a minimal condition the sum of $X_j$ is required to be at least greater than 0.25*VDD due to non-idealities. For other embodiments, where M>2, the sum of $X_j$ for j=1:M−1 is designed to be (M−1)*VDD/M and therefore is designed to be ⅔*VDD for M=3, ¾*VDD for M=4, ⅘*VDD for M=5, but in practice, if a condition were to be put on them to minimally satisfy, that condition due to non-idealities, may be lower than designed values of sum of $X_j$, which is (M−1)*VDD/M.

While one or more of the described embodiments make references to "a majority of the devices" or "a first majority of the devices" or "a second majority of the devices" or "a third majority of the devices" or "a fourth majority of the devices", it is to be understood that this may apply to all devices being substantially similar or all devices having extra terminals or all devices requiring potentials to be generated for the extra terminals, or all devices having substantially similar voltage drops, or all devices having connections being implemented as described, but also applies to not every one of the devices necessarily being substantially similar, or not every one of the devices having extra terminals, or not every one of the devices requiring potentials to be generated for the extra terminals, or not all devices having substantially similar voltage drops, or not every one of the devices connected per the connections described in the array notation due to other reasons. The described embodiments include a reference to a first majority, second majority, third majority and/or a fourth majority of devices. It is to be understood that each of the majorities may be referred to a common majority or one or more may be individually different. Further it is to be understood that the majority of the devices may be all of the devices in the array.

FIG. 6 shows only Vdd_R, Vss_R, Vdd and Vss as the 4 terminals. However, at least some embodiments further include generating several other such source or sink terminal potentials that represent one or more of raised Vss voltages or one or more reduced Vdd voltages or one or more reference voltages as may be desired on any device with a smaller step granularity compared to VDD, and also each device may include of input(s) and output(s) to perform intended functions and likely at least have at least one clock source and other signals but such input and outputs and clock(s) and other source or sink terminals are not shown in the FIG. 6 for clarity.

Observation of FIG. 6 suggests that equal voltage division is achieved for each of the devices by the connections described previously between Vdd and Vss terminals in any column j for a balanced operation wherein in one embodiment all the connections described are made. However, in practice VDD may be slightly different for each device than the desired VDD at least due to manufacturing deviations of each device or at least due to different input vectors causing each device impedance to be slightly different and therefore the voltage drops across each device to be slightly different. The word "substantially same voltage" of the described embodiments is meant to be a voltage that is desired and designed to be the same voltage by the connections described, in the absence of any practical undesirable manufacturing deviations or difference in input vectors or any other practical non-ideal effects of implementation that cause either each of such designed device voltages between Vdd terminal and Vss terminal to differ from the desired VDD voltage or the difference in Vss Terminals between devices (i,j+1) to (i,j) to differ from desired voltage $X_j$. The differences of the potential difference between Vdd and Vss terminals from the desired VDD can be adjusted by adjusting input vectors and/or input clock frequency as among a few exemplary parameters. This is because changing input vectors or input clock frequency changes the impedance of the device and therefore if any non-idealities like manufacturing deviations or other sources of non-idealities were responsible for difference in impedances of the devices to begin with causing such different than VDD drops across them, then such adjustment of impedances of the device through input vectors or clock frequency can compensate for it. For the embodiment shown in FIG. 6, all of the potentials Xj are chosen to be the substantially same voltage X. However, at least some of the described embodiments as shown in FIG. 6 include generating one or more of Vdd_R or Vss_R terminal potentials by generating voltage staggered columns that have a smaller step granularity X than VDD. Note: the voltage drop between Vss of each device (i,j) compared to nearby column device (i,j+1) for i=1:N and j=1:M−1, is different by X so staggered voltages are generated.

For an embodiment, the voltages $X_j$ for j=1:(M−1) for the array of devices are generated by voltage dropping elements ($R_j$) in the array of devices, wherein each of the voltage dropping elements ($R_j$) include an Rx1 terminal and an Rx2 terminal, and wherein each of the voltage dropping elements ($R_j$) facilitating a potential drop across the Rx1 terminal and the Rx2 terminal are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

When reference is made in some embodiments that "voltages $X_j$ for j=1:(M−1) are generated by voltage dropping elements ($R_j$)", it is understood that while at least (M−1) non-zero valued voltage dropping elements are needed to implement M−1 non-zero different voltages, if one or more of the (M−1) voltages $X_j$ is zero, then the value of one or more of those (M−1) voltage dropping elements could also be zero or in other words less than (M−1) non-zero voltage dropping elements may be needed. For several embodiments there may be 2*(M−1) voltage dropping elements implemented in 2 different rows in the array of devices.

For at least some embodiments, the voltage level shifting buffer may be realized by an active circuit that includes of one or more of transistors or even a combination of passive devices, such as, diodes or resistors or capacitors. For various embodiments, when it is referenced that a potential of any terminal in an array is "generated" to be higher than potential of any other terminal in the array, or when it is referenced that the voltages $X_j$ for j=1:(M−1) are generated, the generation assumes at one of the following or more (a) current being passed through the voltage dropping elements which when multiplied by the "effective" resistance of the voltage dropping element generates those voltages $X_j$ or potential differences in the array or (b) the presence of voltage battery or voltage level shifting buffer, which generates the voltage $X_j$ or potential differences in the array. For an embodiment, such generation of $X_j$ voltages between Vss terminals of any devices in same row, between column j to column j+1 can be done by placing voltage dropping elements in only 1 row using M−1 elements (for example in row 1 with the lowest potentials) or in more than 1 rows by another (M−1) additional voltage dropping elements (for example in row 1 and row N with lowest and highest voltages) of the array of devices and for the remainder of the rows the difference $X_j$ between the Vss terminals of columns gets "generated" primarily by the substantially same voltage drop VDD across the devices Vdd and Vss terminals across the entire array and the balanced voltage drops across the entire array, and so (M−1) or more voltage dropping elements would be needed in the array to generate such potential drops across the entire N*M array of devices. For the described embodiments, when referencing $R_j$ as being implemented as a "switched capacitor circuit that functionally behaves as a resistor", that may include any $R_j$ implementation done with an active device that includes a combination of the transistors and/or resistors and/or capacitors and/or diodes and is clocked to function as a switched capacitor resistor. For some embodiments, especially when the voltage drop across the voltage dropping element $R_j$ is large or comparable to a device in the array of devices, the reference to $R_j$ being implemented as a "switched capacitor circuit that functionally behaves as a resistor" may therefore include a device similar or substantially similar to a device from the array of devices that can be configured as a switched capacitor resistor to function as a voltage dropping element $R_j$.

For at least some embodiments, the voltage dropping elements are implemented in various different rows of the array of devices in various different ways that will be discussed later, to achieve voltage drops across them so that the potential of the Vss terminal of each device at any location (i,j+1) of the array of devices is generated to be higher than the potential of the Vss terminal for another device at location (i,j) by a voltage $X_j$, for i=1:N, j=1:(M−1). For several embodiments there may be 2*(M−1) voltage dropping elements implemented in 2 different rows in the array of devices.

For an embodiment, for j=1:M−1, the Rx1 terminal of voltage dropping elements $R_j$ is connected to the Vss terminal of the device at location (1,j+1) in the array of devices, and the Rx2 terminal of $R_j$ is connected to the Vss terminal of one of the j devices at j locations in row 1 from (1,1) to (1,j) in the array of devices.

The described embodiments show that there are very large number of ways, possibly factorial(M−1)=((M−1)* (M−2)* . . . 2*1) ways, to connect the Rj voltage dropping elements across row 1 to allow a Direct Current (DC) path from each of the Vss terminals of devices at locations (1,j) to Vss terminal of the device at location (1,1), and this is because the device at any location (j+1) in row 1 has j different lower potential nodes to connect to, to find a DC path to Vss at location (1,1). It is to be noted that in various embodiments, all the potentials in the array are referred to the potential of the Vss terminal at location (1,1) that is connected to a lower potential terminal of a power supply with voltage N*VDD+(M−1)*X.

For an embodiment, for j=1:M−1, the Rx1 terminal and the Rx2 terminal of the voltage dropping element ($R_j$) in the array of devices are connected to the Vss terminals of the devices at locations (1,j+1) and (1,j) in the array of devices. For this embodiment, the cumulative currents conducted through columns j+1:M is conducted through $R_j$. Therefore, for a voltage drop $X_j$ across the columns j and j+1, the voltage drop across these $R_j$ voltage dropping elements is $X_j$, and the value of the voltage dropping element $R_j = X_j/\text{sum}(I_{j+1}:I_M)$ for j=1:M−1 where $I_j$ represents the current through the column j.

For an embodiment, for j=1:M−1, the Rx1 terminal and the Rx2 terminal of the voltage dropping elements ($R_j$) in the array of devices are connected to the Vss terminals of the devices at locations (1,j+1) and (1,1) in the array of devices. For this embodiment, the individual currents conducted through columns j+1 is conducted through $R_j$. Therefore, for a voltage drop $X_j$ across the columns j and j+1, the voltage drop across these $R_j$ voltage dropping elements is sum($X_1$:

$X_j$) for j=1:(M−1) and the value of the voltage dropping element $R_j$=sum($X_1$:$X_j$)/$I_{j+1}$ for j=1:M−1 where $I_j$ represents the current through the column j. FIG. 6 shows this embodiment where voltage dropping element 651 is placed between (1,1) and (1,2) and voltage dropping element 652 is placed between (1,1) and (1,3).

For at least some embodiments, when the higher potential terminal of M power sources of varying voltages N*VDD+(j−1)*X, are used to provide the Vdd terminal voltages of the devices in column j, for j=1:M in row N, and the lower potential terminal of the M power sources is connected to Vss terminal of (1,1), then such (M−1) voltage dropping elements may be used only in row 1 to generate the $X_j$ voltages. For at least some embodiments, wherein less than M power sources are used, additional voltage dropping elements may be needed in row N or other rows to fully generate the $X_j$ voltages.

For an embodiment, the array of devices comprises additional voltage dropping elements $R2_j$, wherein each of the additional voltage dropping elements $R2_j$ comprise an Rx1 terminal and an Rx2 terminal, and wherein each of the additional voltage dropping elements ($R2_j$) facilitating a potential drop across the Rx1 terminal and the Rx2 terminal are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For an embodiment, the Vss terminal of the device at location (1,1) is connected to a lower potential of two terminals of a power supply and the Vdd terminal of the device at location (N,M) is connected to a higher potential of the two terminals of the power supply, wherein for j=1:M−1, the Rx2 terminal of additional voltage dropping element $R2_j$ is connected to the Vdd terminal of the device at location (N,j) in the array of devices, and the Rx1 terminal of $R2_j$ is connected to the Vdd terminal of one of the (M−j) devices at (M−j) locations in row N from (N,j+1) to (N,M) in the array of devices.

The described embodiments shows that there are very large number of ways, possibly factorial(M−1)=((M−1)*(M−2)* . . . 2*1) ways, to connect the $R2_j$ voltage dropping elements across row N to allow a Direct Current (DC) path from each of the vdd terminals of devices at locations (N,j) to Vdd terminal of the device at location (N,M), and this is because the device at any location j in row N has (M−j) different higher potential nodes to connect to, to find a DC path to Vdd at location (N,M). It is to be noted that in various embodiments, the Vdd terminal of device at location (N,M) is connected to a higher potential terminal of a power supply with voltage N*VDD+(M−1)*X.

For an embodiment, the Vss terminal of the device at location (1,1) in the array of devices is connected to a lower potential of two terminals of a power supply and the Vdd terminal of the device at location (N,M) in the array of devices is connected to a higher potential of the two terminals of the power supply, wherein for j=1:M−1, the Rx1 terminal and the Rx2 terminal of the additional voltage dropping elements ($R2_j$) in the array of devices are connected to the Vdd terminals of the devices at locations (N,j) and (N,j+1) in the array of devices. Therefore, for a voltage drop $X_j$ across the columns j and j+1, the voltage drop across these $R_j$ voltage dropping elements is $X_j$, and the value of the voltage dropping element $R_j$=$X_j$/sum($I_1$:$I_j$) for j=1:M−1 where $I_j$ represents the current through the column j. FIG. 6 shows an embodiment of the array of devices wherein the Vss terminal of the device 111 at location (1,1) is connected to a lower potential (Vss) of two terminals of a power supply, wherein the power supply has a substantially same voltage of N*VDD+(M−1)*X or higher, and the Vdd terminal of the device at location (N,M) is connected to a higher potential of the two terminals of the power supply.

For an embodiment, the Vss terminal of the device at location (1,1) in the array of devices is connected to a lower potential of two terminals of a power supply and the Vdd terminal of the device at location (N,M) in the array of devices is connected to a higher potential of the two terminals of the power supply, wherein for j=1:M−1, the Rx1 terminal and the Rx2 terminal of the additional voltage dropping elements ($R2_j$) in the array of devices are connected to the Vdd terminals of the devices at locations (N,j) and (N,M) in the array of devices. Therefore, for a voltage drop $X_j$ across the columns j and j+1, the voltage drop across these $R2_j$ additional voltage dropping elements is sum($X_{j+1}$:$X_M$), where j=1:(M−1) and the value of the voltage dropping element $R2_j$=sum($X_{j+1}$:$X_M$)/$I_j$ for j=1:M−1 where $I_j$ represents the current through the column j. FIG. 6 shows this embodiment where voltage dropping elements 654 is placed between (N,1) and (N,M) and voltage dropping elements 655 is placed between (N,2) and (N,M).

For an embodiment, when the (M−1) additional voltage dropping elements ($R2_j$) in the array of devices are placed successively between the Vdd terminals of each of the devices at locations (N,j) and (N,j+1) where j=1:M−1, for j=1:M−1, the Rx1 terminal and the Rx2 terminal of voltage dropping element $R_j$ are connected to the Vss terminals of the devices at locations (1,j+1) and (1,j) in the array of devices.

For an embodiment, where the (M−1) additional voltage dropping elements ($R2_j$) in the array of devices are placed successively between the Vdd terminals of each of the devices at locations (N,j) and (N,j+1) where j=1:M−1, for j=1:M−1, the Rx1 terminal and the Rx2 terminal of voltage dropping element $R_j$ are connected to the Vss terminals of the devices at locations (1,j+1) and (1,1) in the array of devices.

For an embodiment, when the (M−1) additional voltage dropping elements ($R2_j$) in the array of devices are placed successively between the Vdd terminals of each of the devices at locations (N,j) and (N,M) where j=1:M−1, for j=1:M−1, the Rx1 terminal and the Rx2 terminal of voltage dropping element $R_j$ are connected to the Vss terminals of the devices at locations (1,j+1) and (1,j) in the array of devices.

For an embodiment, when the (M−1) additional voltage dropping elements ($R2_j$) in the array of devices are placed successively between the Vdd terminals of each of the devices at locations (N,j) and (N,M) where j=1:M−1, for j=1:M−1, the Rx1 terminal and the Rx2 terminal of voltage dropping element $R_j$ are connected to the Vss terminals of the devices at locations (1,j+1) and (1,1) in the array of devices. This embodiment where 2*(M−1) voltage dropping elements are used and where $R_j$ are implemented in row 1 between (1,1) and (1,j+1) for j=1:(M−1), is shown in FIG. 6 where the 651, 652, 653 comprise the Rj elements shown.

For an embodiment, wherein for j=1:M−1, the Rx2 terminal of additional voltage dropping element $R2_j$ is connected to the Vdd terminal of the device at location (N,j) in the array of devices, and the Rx1 terminal of $R2_j$ is connected to the Vdd terminal of one of the (M−j) devices at (M−j) locations in row $X_j$ from (N,j+1) to (N,M) in the array of devices, wherein for j=1:M−1, the Rx1 terminal of voltage dropping element $R_j$ is connected to the Vss terminal of the device at location (1,j+1) in the array of devices, and the Rx2 terminal of voltage dropping element $R_j$ is connected to the Vss terminal of one of the j devices at j locations in row 1 from (1,1) to (1,j) in the array of devices.

In the described embodiment, there are factorial(M−1) ways to connect the additional voltage dropping elements in row $X_j$ and another factorial(M−1) ways to connect the voltage dropping elements in row 1 resulting in very large number (factorial(M−1))² of combinations possible to implement the (M−1) voltage dropping elements and (M−1) additional voltage dropping elements both.

At least some other embodiments include different mechanisms of placing the (M−1) voltage dropping elements in different rows. For at least some embodiments, the voltage dropping elements in row 1 can be placed where some are directly connected from any column Vss terminal of device at location (1,s) to (1,1) and other voltage dropping elements are connected in series from (1,j) to (1,j+1) from j=1: (s−2) and j=(s+1):(M−1). For at least some embodiments, the voltage dropping elements in row N can be placed where some are directly connected from any column Vdd terminal of device at location (N,s) to (N,M) and other voltage dropping elements are connected in series from (N,j) to (N,j+1) from j=1:(s−2) and j=(s+1):(M−1). For at least some embodiments, the drops $X_j$ can be implemented by introducing voltage dropping elements in other rows 2:N in yet other embodiments, or by introducing some of the (M−1) voltage dropping elements in 1 row i and then yet the other voltage dropping elements in another portion of another row (i+f) where f can be anywhere from 1:(M−1).

It is to be understood that when the described embodiments refer to "substantially same as N*VDD+(M−1)*X" that this mean the power supply voltage is to be "designed" to have a "nominal" value of N*VDD+(M−1)*X for optimal drops across the entire array. However practical manufacturing tolerances and practical variations in power supply that is designed to have such nominal values of N*VDD+(M−1)*X can often cause the power supply voltage to be lower and sometimes higher than that designed nominal voltage just due to variations or other reasons. It is to further be further understood that in at least some embodiments, the connection between the Vss terminal of the device at location (1,1) to the lower potential of two terminals of the power supply may not be direct and may be through 1 or more voltage dropping elements or even other elements that are used for power supply filtering circuits or other purposes and the connection between the Vdd terminal of the device at location (N, M) to the higher potential of two terminals of the power supply may also not be direct but may be through 1 or more voltage dropping elements or even other interposing elements that are used for power supply filtering or other purposes. When the described embodiments describe that potential difference of the power supply is to be kept substantially same as N*VDD+(M−1)*X or "higher", the reference to "higher" being if any voltage dropping or other interposing elements are introduced between the terminals of the power supply and the terminals (1,1) in some embodiments, or between the terminals of the power supply and the terminals (N, M) in other embodiments, then even the nominal value of power supply would need to be higher than N*VDD+(M−1)*X.

Further, when the described embodiments state that the connections include "is connected to" "being connected to" or "connections" whether between Vss terminals to Vdd terminals of different devices of array of devise or between Vdd_R terminals or Vss_R terminals or other terminals of any of the devices in the array of devices to other terminals, such as, Vdd terminals or Vss terminals of any of the other devices in the array of devices, the connections may not necessarily be shorted connections (where a shorted connection between 2 terminals are defined as a connection via an electrical wire whether realized on an IC or PCB, with intended zero, but practicably, some, though negligible resistance). For the described connections, wherever reference is made to "is connected to" "being connected to" or "connections", whether individually between two terminals of any two devices or same device, whether in array notation or not, or whether between a transistor terminal to a supply or sink terminal, could be through interposing filtering circuits or other interposing elements between any 2 connected terminals described in the connection, wherein such interposing elements or filtering circuits in between, do not affect the desired functionality of achieving the same or similar voltage of the two terminals that such a described connection between the two terminals intends to achieve. The reference to a digital logic cell being "directly connected to" any terminals V1 and V2 in general has been previously clarified.

For various embodiments, the voltage dropping elements are implemented in row 1, and the highest supply voltage for row N, N*VDD+(j−1)X in any column j, for j=1:M can be generated individually through many different mechanisms and therefore not shown in the Figures. However, FIG. 6 show only 1 exemplary embodiment (b) for generating the N*VDD+(j−1)*X voltages, where all of $X_j$ are substantially same voltage X. The three exemplary embodiments includes (a) where M different power sources (for example Voltage Regulator provided power supplies) with voltages N*VDD+(j−1)X, for j=1:M, supply each columns highest power supply voltage connected to Vdd terminal in row N for column j and the lower potential of such M different power sources is connected to Vss terminal of device (1,1), or (b) where only 1 power supply N*VDD+(M−1)X at column M is used and a mechanism is devised to derive the individual highest voltages of Vdd Terminal of each column N*VDD+(j−1)*X where j=1:M, from that highest voltage N*VDD+(M−1)X by implementing additional (M−1) voltage dropping elements across row N between all columns j and j+1 where j=1:M−1, or (c) where some intermediate number Y, where Y is between 1 and M, of power sources (for example Voltage Regulated provided power supplies) are used to supply the Vdd terminal of Y columns of devices in row N, with desired voltage of N*VDD+(j−1)X for j=1:M for those Y columns, and where each of the remaining voltages N*VDD+(j−1)X for j=1:M that are not directly provided by such Y power sources are generated by placing voltage dropping elements between the terminals that are connected to the Y power sources, wherein the lower potential of such Y different power sources is connected to Vss terminal of device (1,1). It may be difficult to generate all of the M different staggered voltages N*VDD+(j−1)*X for j=1:M in the entire array from different Voltage Regulated power supplies with a degree of accuracy to generate the desired staggered voltage X between the columns of the array. This is because the desired difference in each of the M voltage regulated power supplies with individual voltages N*VDD+(j−1)*X would only be a voltage of X, and if there is a tolerance (+−T %, where T % is usually at least 3% in practice) in the realization of the individual voltages N*VDD+(j−1)*X from Regulated power supplies, then if X is less than T %*(N*VDD+(j−1)*X) then a loss of desired staggered voltages in the array may happen for certain values of T, N, VDD and X. If T %*(N+1)*VDD>VDD/2, then in an embodiment only 1 power source for the entire N*M array at row N may be used to allow staggered voltages X between columns, depending on values of T %, N, VDD and the accuracy desired on the generation of X. In some embodiments, it can be shown that the power supplies for the highest voltage for each individual column j with staggered different voltages (N*VDD+(j−1)*X) can be generated in a balanced way by a single Voltage Regulated Power supply (or multiple Voltage Regulated Power Supply in parallel) with two terminals having a potential difference of N*VDD+(M−1)*X for column M, which therefore can supply the entire array which reduces the need for Voltage Regulation Supplies for each individual column. In an embodiment, controlling the voltage dropping elements externally or choosing appropriate values of voltage dropping elements such inaccuracies in staggered voltages (N*VDD+(j−1)*X) if realized from single source N*VDD+(M−1)*X may be minimized. Yet it is also anticipated here in such embodiments that such Voltage Dropping elements while if controlled can provide accuracy in voltage may not result in low impedance at source points N*VDD+(j−1)*X OR the aggregation of current of the entire array through a single Regulated Power supply Source may result in large I*R drops wherever such current is routed through. Therefore in other embodiments stated in (c) more than 1 (or in general Y) such power supplies at different columns may be used to supply the currents of various columns of the array to not result in a current aggregation at the Single Regulated Power source of N*VDD+(M−1)*X, wherein such Y Regulated Power Sources may not be in contiguous columns but significant number of U columns apart and done when U*X>T %*(N*VDD+(j−1)*X) for various values of U, X, T, N, VDD.

For an embodiment, each of (M−G) voltages equal to sum($X_j$:$X_{j+G-1}$), for j=1:(M−G), is substantially the same as a smaller of (X1,X2), and each of (M−(G+Z)) voltages equal to sum($X_j$:$X_{j+(G+z)-1}$), for j=1:(M−(G+Z)), is substantially the same as a larger of (X1,X2), where G is a positive integer, and Z is a whole number. Whole numbers are inclusive of 0 and all positive integers are greater than or equal to 1.

For an embodiment, when X1 is smaller than X2, then for a second majority of devices in the first plurality of the devices in the array of devices, for i=1:N and for j=(G+1):M, the Vdd_R terminal of the device at location (i,j) is connected to the Vdd terminal of the device at location (i,j−G) and for i=1:N and for j=1:G, the Vdd_R terminal of the device at location (i,j) is connected to the Vss terminal of the device at location (i,j−G+M), where G is a positive integer; for a second majority of devices in the first plurality of the devices in the array of devices, for i=1:N; and for j=1:(M−(G+Z)), the Vss_R terminal of the device at location (i,j) is connected to the Vss terminal of the device at location (i,j+(G+Z)) and for i=1:N and for j=(M−(G+Z)+1):M, the Vss_R terminal of the device at location (i,j) is connected to the Vdd terminal of the device at location (i, j+(G+Z)−M), where Z is a whole number.

For an embodiment, wherein when X2 is less than or equal to X1, then for a second majority of devices in the first plurality of the devices in the array of devices, for i=1:N and for j=((G+Z)+1):M, the Vdd_R terminal of the device at location (i,j) is connected to the Vdd terminal of the device at location (i,j−(G+Z)) and for i=1:N and for j=1:(G+Z), the Vdd_R terminal of the device at location (i,j) is connected to Vss terminal of the device at location (i,M+j−(G+Z)), where G is a positive integer and Z is a whole number; for a second majority of devices in the first plurality of the devices in the array of devices, for i=1:N and for j=1:M−G, Vss_R terminal of the device at location (i,j) is connected to the Vss terminal of the device at location (i,j+G) and for i=1:N and for j=(M−G+1):M, the Vss_R terminal of the device at location (i,j) is connected to the Vdd terminal of the device at location (i,j+G−M).

While the terms "at least a second majority of the devices in the array of devices" or "at least a third majority of the devices in the array of devices" are stated, in an embodiment, the connections as described with array notation if implemented for almost all devices, may result in an embodiment that has one of the most balanced array mechanisms to derive the potential of the extra Vdd_R and Vss_R and/or other terminals as described.

For an embodiment, each device has a difference in potential between Vdd terminal and Vss terminal of a desired potential of VDD. Observation of FIG. 6 suggests that equal voltage division is achieved for each of the devices by the connections described previously between Vdd and Vss terminals in any column j for a balanced operation where in 1 embodiment all the connections described are made. However, in practice VDD may be slightly different for each device than the desired VDD at least due to manufacturing deviations of each device or at least due to different input vectors. Such differences of the potential difference between Vdd−Vss to the desired VDD can be attempted to be adjusted (compensated) by adjusting input vectors and/or input clock frequency as among a few exemplary parameters. For an embodiment, this is accomplished because changing input vectors or input clock frequency changes the impedance of the device, and therefore, if any non−idealities, such as, manufacturing deviations or other sources of non−idealities responsible for difference in impedances of the devices to begin with causing such different than VDD drops across them, then such adjustment of impedances of the device through input vectors or clock frequency can compensate for the non−idealities.

For an embodiment, one of more of the devices within the array of devices are controllable by one or more external parameters or inputs, wherein changing the external parameters or inputs changes an impedance of the one of more of the devices within the array of devices, and the potential difference between the Vdd terminal and the Vss terminal of the one or more of the devices within the array of devices.

For an embodiment, for the array of devices, the external parameters or inputs comprise at least a clock frequency of operation of the one or more devices within the array of devices.

Similar as described for the devices in the array, the voltage dropping elements can also have more than 2 terminals and be controllable by external parameters or additional inputs at those additional terminals to those voltage dropping elements other than the 2 terminals in the array shown. For an embodiment, the external parameters or inputs can control the potential drop between the 2 terminals of the voltage dropping elements in the array, by changing either the impedance or other characteristics of those voltage dropping elements. For an embodiment, changes of the voltage dropping elements can be used to make sure the substantially same voltage drop desired across those voltage dropping elements (X or jX or (M−j)*X), for different values of j wherein for an embodiment, $X_j$ for j=1:M−1 are substantially the same voltage X, is achieved to a better degree of accuracy, even in presence of either the currents through the voltage dropping elements being different from desired or the desired values of the voltage dropping elements being different from desired, in either case due to practical manufacturing tolerances or temperature or voltage variations. For at least some embodiments, the external parameters or the inputs to the devices in the array of devices can be a clock frequency if such voltage dropping elements are implemented as a switched capacitor resistor. If the implementation of the voltage dropping elements includes resistors, the resistors can be selected to be different than what an ideal design or calculated value would be to account for the non-ideal drop in voltages due to difference in current in the columns due to manufacturing tolerances in the devices and temperature variations. For an embodiment, if the resistors are programmable by external inputs, then such external inputs can be changed so that the value of the resistors is adjusted until the voltage drop across the resistors is as close to provide the desired drop across the resistors For an embodiment, for the array of devices, the one or more of the voltage dropping elements ($R_j$) are controllable by one or more external parameters or inputs to the voltage dropping elements ($R_j$) wherein changing the one or more external parameters or inputs changes a potential difference across terminals of the voltage dropping elements ($R_j$).

For an embodiment, for the array of devices, the one or more of the voltage dropping elements ($R_j$) and additional voltage dropping elements ($R2_j$) are controllable by one or more external parameters or inputs to the voltage dropping elements ($R_j$, $R2_j$) wherein changing the one or more external parameters or inputs changes a potential difference across terminals of the voltage dropping elements ($R_j$, $R2_j$).

At least some embodiments include 3 or more supply or sink terminals even though not shown in the Figures. The number of combinations for such voltages being closer to Vdd or Vss or the difference between those voltages to Vss or Vdd is large. However, the techniques and methods for these embodiments are described herein in general to derive the voltages of all the terminals from the array of devices if the spacing of the voltages between the columns $X_j$ is chosen to accommodate a large number of terminal voltage generations.

For an embodiment, the mixed signal device includes a fourth plurality of digital logic cells being directly connected to a Vdd_R2 terminal and a Vss_R2 terminal, wherein the potential difference between the Vdd_R2 terminal and the Vss terminal is (VDD−X3) and the potential difference between the Vss_R2 terminal and the Vss terminal is X4, wherein X3 and X4 are positive voltages and X3 and X4 both are less than half of VDD, wherein a "sixth ratio" defined as $(VDD-X3-X4)^2/(VDD)^2$ is less than a fifth preselected number.

For an embodiment, the mixed signal device includes a fifth plurality of digital logic cells being directly connected to a Vdd_R terminal and a Vss_R2 terminal, wherein the potential difference between the Vdd_R terminal and the Vss terminal is (VDD−X1) and the potential difference between the Vss_R2 terminal and the Vss terminal is X4, wherein X1 and X4 are positive voltages and X1 and X4 both are less than half of VDD, wherein a "seventh Ratio" defined as $(VDD-X1-X4)^2/(VDD)^2$ is less than a sixth preselected number.

For an embodiment, the mixed signal device includes a sixth plurality of digital logic cells being directly connected to a Vdd_R2 terminal and a Vss_R terminal, wherein the potential difference between the Vdd_R2 terminal and the Vss terminal is (VDD−X3) and the potential difference between the Vss_R terminal and the Vss terminal is X2, wherein X3 and X2 are positive voltages and X3 and X2 both are less than half of VDD, wherein a "eighth Ratio" defined as $(VDD-X3-X2)^2/(VDD)^2$ is less than a seventh preselected number.

For an embodiment, the voltage X3 is greater than X1 and voltage X4 is greater than X2.

For an embodiment, wherein the mixed signal device includes Zmax number of additional terminals to source and sink currents to additional pluralities of digital cells or to act as a reference voltage; wherein the desired potential difference of the additional terminals to Vss terminal of the mixed signal device is different than VDD or (VDD−X1) or X2 and the desired potential differences of the additional terminals compared to Vss terminal of the mixed signal device are referred to as $VDTer_z$; wherein a majority of (M−C(z)) voltages, $(sum(X_j:X_{j+C(x)-1})$ for j=1:(M−C(z))), is substantially the same as $min(VDD-VDTer_z, VDTer_z)$ for z=1:Zmax, where each of C(z) is a positive integer for z=1:Zmax.

For at least some embodiments, the connections of the $V\_Ter_z$ terminals are implemented based on the following: For values of index z from 1:Zmax where a potential of terminal $V\_Ter_z$ is desired to be generated by the array of devices and a desired potential difference of terminal $V\_Ter_z$ to terminal Vss in the device with terminal $V\_Ter_z$, is $VDTer_z$; a majority of (M−C(z)) voltages, $(sum(X_j:X_{j+C(z)-1})$ for j=1:(M−C(z))), is substantially the same as $min(VDD-VDTer_z, VDTer_z)$, where each of C(z) is a positive integer. Other described embodiments may include "each of (M−C(z)) voltages, $(sum(X_j:X_{j+C(z)-1})$ for j=1:(M−C(z))), is substantially the same as $min(VDD-VDTer_z, VDTer_z)$ for z=1:Zmax, where each of C(z) is a positive integer", wherein it is to be understood that in other embodiments, only "a majority" instead of "each" of such (M−(C(z)) voltages may meet the above condition. Other described embodiments may include "at least one of (M−C(z)) voltages, $(sum(X_j:X_{j+C(z)-1})$ for j=1:(M−C(z)), is substantially the same as $min(VDD-VDTer_z, VDTer_z)$ for z=1:Zmax, where each of C(z) is a positive integer" where reference is made to "at least one of (M−C(z) voltages" instead of "a majority of (M−C(z)) voltage"

For the embodiments described, sum( ) notation represents the summation of all elements inside the parenthesis and in the case there is only one element inside parenthesis, the sum( ) represents that element and min( ) represents the minimum of all elements inside the parenthesis and in the case if all elements are equal than min represents one of the elements inside the parenthesis. For this embodiment, to clarify the array notation, "$(sum(X_j:X_{j+C(z)-1})$ for j=1:(M−C(z)))" comprises of a vector of (M−C(z)) different voltages for a given value of index z, $(sum(X_1:X_{C(z)}), sum(X_2:X_{C(z)+1}), \ldots sum(X_{M-c(z)}:X_{M-1}))$ and a majority (or each) of these elements of the vector must be the same as the desired drop $min(VDD-VDTer_z, VDTer_z)$ for any given value of index z. For this embodiment, $sum(X_1:X_{C(z)})$ for j=1 is the first voltage out of (M−C(z)) voltages, and for example $sum(X_{M-c(z)}:X_{M-1})$ for j=(M−C(z)) is the $(M-C(z))^{th}$ voltage. For an embodiment, wherein Zmax=2, M=8; the voltages $X_j$ are to be such that, for z=1, C(1)=2, there are (M−C(z)) or (8−2) or 6 voltages that are $(X_1+X_2)$, $(X_2+X_3)$, $(X_3+X_4)$, $(X_4+X_5)$, $(X_5+X_6)$, $(X_6+X_7)$ that are supposed to be substantially same as $min(VDD-VDTer_1, VDTer_1)$; and for z=2, C(2)=3, there are (8−3) or 5 voltages that are $(X_1+X_2+X_3)$, $(X_2+X_3+X_4)$, $(X_3+X_4+X_5)$, $(X_4+X_5+X_6)$, $(X_5+X_6+X_7)$ that are supposed to be substantially same as min(VDD−VDTer2,VDTer2) for the array of devices.

For described embodiments, when any two voltages are compared to each other or stated to be ""substantially same"

or "substantially the same" or any potential differences are compared to a voltage and being stated as "substantially same" or "substantially the same", such potential differences or voltages when designed to be nominally the same value as VDD or VDD/2 or $VDTer_z$ or $(VDD-VDTer_z)$ as the reference may be, but due to all non-idealities (mismatches, manufacturing tolerances, temperature variations, noise, undesirable I*R drops), such potential differences or voltages can differ from the desired or designed voltages by differing amounts and even different percentage deviations. For some embodiments, the percentage deviation may be higher when the voltage being compared to is lower and percentage deviation from the designed value may be higher when the voltage being compared to is higher.

For some embodiments, therefore when stated "and wherein a sum of all N voltages for j=1:(M−1) is greater than or substantially same as VDD/2;" the sum of all N is designed to be "greater than or equal to VDD/2"; wherein for M=2, the sum of all $X_j$ for j=1:M−1 (only one element $X_1$) is designed to be equal to VDD/2, but due to non-idealities the sum of $X_j$ may vary from 0.8*VDD/2 to 1.2*VDD/2 and several embodiments are described that can reduce such variations. For some embodiments, depending on value of M, the sum of all $X_j$ is designed to be "equal to (M−1)*VDD/M", but due to non-idealities or noise in some embodiments, it may vary by +/−20% from the designed value and several embodiments are described that can reduce such variations. For some embodiments, therefore the limiting or defining condition on the sum of all $X_j$ for j=1:M−1 is kept to be "greater than 0.25*VDD" or "greater than or substantially same as VDD/2".

For some embodiments, therefore when stated "wherein a majority of (M−C(z)) voltages, $(sum(X_j:X_{j+C(z)-1})$ for j=1:(M−C(z))), is substantially the same as $min(VDD-VDTer_z, VDTer_z)$" the majority of (M−(Cz)) voltages may be designed to be equal to $min(VDD-VDTer_z, VDTer_z)$, but due to non-idealities, the majority of these (M−C(z)) voltages may be within +50% or −50% of these $min(VDD-VDTer_z, VDTer_z)$ voltages or between 50% of $min(VDD-VDTer_z, VDTer_z)$ and 150% of $min(VDD-VDTer_z, VDTer_z)$, depending on how low the values of $min(VDD-VDTer_z, VDTer_z)$ is, due to higher effect of non-idealities at smaller voltages, wherein such smaller voltages are further realized in the array based on the difference of voltages of devices with expected equal voltage division of VDD across them. For some embodiments, such large deviations from expected to actual voltages may put a lower limit on realizable "granularity" of the $V\_Ter_z$ terminal voltages to not choose too small of a voltage $VDD-VDTer_z$ or $VDTer_z$ for terminal voltages, depending further also on the absolute value of VDD. Several other embodiments are described to lower the deviation of such voltages from the designed values.

For an embodiment, wherein for at least a third majority of the first plurality of the devices in the array of devices, for i=1:N and for j=1:M and for z=1:Zmax, when $(VDD-VDTer_z)$ is less than $VDTer_z$, then when (j−C(z)) is greater than or equal to 1, then $V\_Ter_z$ terminal of the device at location (i,j) is connected to the Vdd terminal of the device at location (i,j−C(z)) and when (j−C(z)) is less than 1, then $V\_Ter_z$ terminal of the device at location (i,j) is connected to the Vss terminal of the device at location (i,j−C(z)+M), and when $(VDD-VDTer_z)$ is greater than or equal to $VDTer_z$, then when (j+C(z)) is less than or equal to M, then $V\_Ter_z$ terminal of the device at location (i,j) is connected to the Vss terminal of the device at location (i,j+C(z)) and when (j+C(z)) is greater than M, then $V\_Ter_z$ terminal of the device at location (i,j) is connected to the Vdd terminal of the device at location (i,j+C(z)−M). For this embodiment, the above describes the connections for an array of devices to derive the desired voltages of additional $V\_Ter_z$ terminals from the array of devices.

For embodiments described above method and apparatus is shown to connect many different terminals in the mixed signal device to derive their voltages from the array of devices.

Use Cases of the Described Embodiments

Various Embodiments have been shown here for achieving a significant power reduction by employing Vdd_R and Vss_R extra terminals. Such reduced power supply terminal or raised Vss terminal can be used to lower the power in areas of digital logic cells that are lesser timing critical than cells for which the timing is very critical. Usually, critical timing paths comprise only a minority of the logic in any digital design and running the remainder of the digital logic at supply voltages of VDD that is needed for the critical timing path circuits is non-optimal. Majority of the logic that is not timing constrained can benefit from the choice of digital logic cells with (Vdd_R, Vss_R) terminals, which are reduced supply and raised grounds to the level that the timing of the non-critical timing paths is met and significant power savings are achieved. The choice of X1 and X2 as detailed in the embodiments presented before can result in symmetrical rise and fall times and lesser delays at the interface of digital logic cells operating at (Vdd,Vss) to digital logic cells operating at (Vdd_R,Vss_R), thereby allowing to use interspersed cells of (Vdd, Vss) to (Vdd_R, Vss_R) in areas where timing is important but not too critical. For the embodiments described, by use of (Vdd_R, Vss_R) terminals in digital logic cells of second plurality, the need for area inefficient level shifters between the logic domains can be avoided. Furthermore in several described embodiments, the use of (Vdd_R, Vss_R) terminals in digital logic cells of second plurality, as opposed to realizing the same Xtotal for a given desired power reduction using digital logic cells with (Vdd_R, Vss) terminal or digital logic cells with (Vdd, Vss_R) terminals, allows the use of the cells from different power domains in the same N-well or substrates without needing extra Deep N-wells or extra Nwells resulting in low cost, area and power efficient design. Power delay product and efficient implementation of different level of timing critical portions of design can therefore be optimized by use of digital logic cells with (Vdd_R, Vss_R) terminals. Finally for low values of Vdd, for intensive compute applications, it may be difficult to draw such supply voltages from a Regulated power supply source and even more impractical to derive the voltages of such (Vdd_R, Vss_R), or even (Vdd_R,Vss) or (Vdd,Vss_R) terminals voltages from Regulated Power supply sources to optimize the power where X1 and X2 can be chosen to a granularity of as low as 25 mV or 50 mV. A powerful technique is described in various embodiments using an array of similar devices to allow to derive such low voltages VDD and realize the granularity of the voltages X2 and/or VDD−X1 without the need for impractical Regulated power supply sources and such technique can be applied in a large number of compute intensive applications. The techniques presented in various embodiments are especially useful when a large number of engines are used in parallel to realize high intensity compute applications whether such large number of compute engines are monolithically realized on one IC or several ICs or even on wafer level, as terminals from other "devices" are devised to be used for the neighboring devices. It can further be realized that techniques presented in various embodiments, are not limited to the embodiments of realizing only Vdd_R and Vss_R voltage domain digital logic cells, but can also extend to a set of voltages Vdd_R2 and/or Vss_R2 which can be further chosen if there are 3 or more partitions in the voltage domains are to be chosen for power optimization whereby the first partition is the most timing critical circuits, the second partition is medium level timing critical circuits and the third partition is even less timing critical circuits and so on and so forth. All such extra voltages in many embodiments can once again be generated by the techniques described in the embodiments of a 2 dimensional array of substantially similar devices, that is not burdensome for such generation wherein for high intensity compute applications such a large number of parallel processing engines were needed anyway, whether as a monolithic implementation or on a PCB implementation of such devices or on wafer level, to realize the throughput desires.

Although specific embodiments have been described and illustrated, the embodiments are not to be limited to the specific forms or arrangements of parts so described and illustrated. The described embodiments are to only be limited by the claims.

What is claimed:

1. A mixed signal device comprising of at least a plurality of digital logic cells, comprising:
   a first plurality of digital logic cells being directly connected to a Vdd terminal and a Vss terminal, wherein a potential difference between the Vdd terminal and Vss terminal is a VDD;
   a second plurality of digital logic cells being directly connected to a Vdd_R terminal and a Vss_R terminal, wherein a potential difference between the Vdd_R terminal and the Vss terminal is (VDD−X1), and a potential difference between the Vss_R terminal and the Vss terminal is X2, wherein X1 and X2 are positive voltages and X1 and X2 both are less than half of the VDD;
   wherein at least one digital logic cell of the first plurality of digital logic cells has at least one of (a) an input connected to an output of at least one digital logic cell of the second plurality, or (b) an output connected to an input of at least one digital logic cell of the second plurality;
   wherein a first ratio of the voltage X1 to the voltage X2 is selected in a preselected range; and
   a storage digital logic cell, wherein the storage digital logic cell comprises at least one digital logic cell of the first plurality of digital logic cells and at least one digital logic cell of the second plurality of digital logic cells, and wherein the at least one digital logic cell of the first plurality of digital logic cells is configured to be in a feedforward path from an input of the storage digital logic cell to an output of the storage digital logic cell and the at least one digital logic cell of the second plurality of digital logic cells is configured to be in a feedback path from an output to an input of the storage digital logic cell.

2. The mixed signal device of claim 1, wherein the preselected range is (0.3,3.3).

3. The mixed signal device of claim 1, wherein a second ratio that is defined as $(VDD-X1-X2)^2/(VDD)^2$ is less than a first preselected number.

4. The mixed signal device of claim 1, wherein each of voltages $(VDD-X1-V1_{thn})$ and $(VDD-X2-V1_{thp})$ is greater than a second preselected number, wherein $V1_{thp}$ is a threshold voltage of a PMOS transistor and $V1_{thn}$ is a threshold voltage of a NMOS transistor, wherein the first plurality of digital logic cells includes the PMOS transistor and the NMOS transistor.

5. The mixed signal device of claim 1, wherein each of voltages $(VDD-X_2-V2_{thn})$ and $(VDD-X1-V2_{thp})$ is greater than a third preselected number, wherein $V2_{thp}$ is the threshold voltage of a PMOS transistor and $V2_{thn}$ is the threshold voltage of a NMOS transistor, wherein the second plurality of digital logic cells includes the PMOS transistor and the NMOS transistor.

6. The mixed signal device of claim 1, wherein each of voltages $(VDD-X1-X2-V2_{thn})$ and $(VDD-X1-X2-V2_{thp})$ is greater than a fourth preselected number, wherein $V2_{thp}$ is the threshold voltage of a PMOS transistor and $V2_{thn}$ is the threshold voltage of a NMOS transistor, wherein the second plurality of digital logic cells includes the PMOS transistor and the NMOS transistor.

7. The mixed signal device of claim 1, wherein at least one of a plurality of outputs of a digital logic cell of the first plurality of digital logic cells, is connected to at least one of a plurality of inputs of a digital logic cell of the second plurality of digital logic cells, and further at least one of a plurality of outputs of the digital logic cell of the second plurality of digital logic cells, is connected to at least one of a plurality of inputs of a different digital logic cell of the first plurality of digital logic cells.

8. The mixed signal device of claim 1, wherein at least one of a plurality of outputs of a digital logic cell of the second plurality of digital logic cells, is connected to at least one of a plurality of inputs of a digital logic cell of the first plurality of digital logic cells, and further at least one of a plurality of outputs of the digital logic cell of the first plurality of digital logic cells is connected to at least one of a plurality of inputs of a different digital logic cell of the second plurality of digital logic cells.

9. The mixed signal device of claim 1, wherein at least one digital logic cell of the second plurality of digital logic cells, comprises an NMOS transistor, wherein a body terminal of the NMOS transistor is connected to the Vss terminal.

10. The mixed signal device of claim 1, wherein at least one digital logic cell of the second plurality of digital logic cells, comprises a PMOS transistor, wherein a body terminal of the PMOS transistor is connected to the Vdd terminal.

11. The mixed signal device of claim 1, wherein at least one of the potential difference between the Vdd terminal and the Vss terminal, or the potential difference between the Vdd_R terminal and the Vss terminal, or the potential difference between the Vss_R terminal and the Vss terminal, is generated by an array of devices, wherein a first plurality of devices in the array of devices are substantially similar to the mixed signal device, and the first plurality of devices in the array of devices includes the mixed signal device, and wherein the array of devices includes one or more dimensions.

12. The mixed signal device of claim 1, wherein a third ratio of a first number of the digital logic cells of the second plurality of digital logic cells in the mixed signal device to a second number of the digital logic cells of the first plurality of digital logic cells in the mixed signal device exceeds a preselected number designated as cellcount1.

13. The mixed signal device of claim 1 comprising of T timing domains, where each of T timing domains comprise a third plurality of digital logic cells;
   wherein $RT1_t$ is a fourth ratio of the number of digital logic cells of the second plurality to the number of digital logic cells of the first plurality, in a timing domain t of the T timing domains, for t=1:T;

wherein $RT1_t$ is greater than a preselected number cell-ratio$_t$ for t=1:T; and wherein $RT1_t$ is lesser than $RT1_{t+1}$ for t=1:T−1, where T is a positive integer greater than or equal to 2.

14. The mixed signal device of claim 13, wherein each timing domain t has a fifth ratio $RT2_t$ defined as substantially same as a ratio of a sum of propagation delays of all digital logic cells in the timing domain t divided by a total number of logical and storage operations performed in the timing domain t; and wherein $RT2_t$ is lesser than $RT2_{t+1}$ for t=1:T−1.

15. The mixed signal device of claim 13, wherein each timing domain t has a higher number of critical timing paths than timing domain t+1 for t=1:T−1.

* * * * *